(12) United States Patent  
Oliver et al.

(10) Patent No.: US 8,928,309 B2  
(45) Date of Patent: Jan. 6, 2015

(54) SYSTEM AND METHOD FOR OPERATING A MOBILE DEVICE HAVING A MAGNETOMETER USING ERROR INDICATORS

(75) Inventors: Robert George Oliver, Waterloo (CA); Nazih Almalki, Waterloo (CA)

(73) Assignee: BlackBerry Limited, Waterloo (CA)

( * ) Notice: Subject to any disclaimer, the term of this patent is extended or adjusted under 35 U.S.C. 154(b) by 324 days.

(21) Appl. No.: 13/484,913

(22) Filed: May 31, 2012

(65) Prior Publication Data

US 2013/0320965 A1 Dec. 5, 2013

(51) Int. Cl.  
*G01R 35/00* (2006.01)

(52) U.S. Cl.  
USPC .......................................... 324/202; 324/244

(58) Field of Classification Search  
USPC .......................................... 324/202, 225, 244  
See application file for complete search history.

(56) References Cited

U.S. PATENT DOCUMENTS

| | | | |
|---|---|---|---|
| 6,836,971 B1 | 1/2005 | Wan | |
| 7,684,904 B2 | 3/2010 | Wainwright et al. | |
| 8,531,180 B2 * | 9/2013 | Piemonte et al. | 324/207.11 |
| 2005/0240347 A1 | 10/2005 | Yang | |
| 2006/0031014 A1 | 2/2006 | Sato et al. | |
| 2008/0042973 A1 | 2/2008 | Zhao et al. | |
| 2009/0184849 A1 | 7/2009 | Nasiri et al. | |
| 2010/0312509 A1 | 12/2010 | Patel et al. | |
| 2010/0312513 A1 * | 12/2010 | Mayor et al. | 702/104 |
| 2012/0062223 A1 | 3/2012 | Olsson et al. | |
| 2012/0086438 A1 * | 4/2012 | Tu | 324/202 |
| 2012/0098525 A1 | 4/2012 | Snow et al. | |
| 2012/0157158 A1 * | 6/2012 | Mayor et al. | 455/556.1 |
| 2013/0181811 A1 * | 7/2013 | Mayor et al. | 340/6.1 |

FOREIGN PATENT DOCUMENTS

| | | |
|---|---|---|
| EP | 0268278 B1 | 1/1993 |
| EP | 2009395 A2 | 12/2008 |
| EP | 2447670 A2 | 5/2012 |
| JP | H2-10111 A | 1/1990 |
| WO | 2011123149 A1 | 10/2011 |

OTHER PUBLICATIONS

Paller, Gabor; Measuring movement with accelerometer and gyroscope; http://www.sfonge.com/forum/topic/measuring-movement-accelerometer-and-gyroscope; available on the Internet as early as Jan. 20, 2012, retrieved from the Internet Apr. 2, 2012.

Paller, Gabor; Compensating accelerometer data with the gyroscope; http://www.sfonge.com/forum/topic/compensating-accelerometer-data-gyroscope, available on the Internet as early as Jan. 25, 2012; retrieved from the Internet Apr. 3, 2012.

Gadget Gangster: Accelerometer & Gyro Tutorial; http://www.instructables.com/id/accelerometer-gyro-tutorial/; available on the Internet as early as Jan. 21, 2010; retrieved from the Internet May 24, 2012.

Berbil, Bautista, L.; Search Report from corresponding European Application No. 12170348; Search completed Oct. 2, 2012.

* cited by examiner

*Primary Examiner* — Jay Patidar  
(74) *Attorney, Agent, or Firm* — Brett J. Slaney; Thomas Y. T. Wong; Blake, Cassels & Graydon LLP

(57) ABSTRACT

A method and system are provided for operating a mobile device having a magnetometer. The method includes obtaining a plurality of error indicators associated with the magnetometer. At least two of the plurality of error indicators have different criteria for error. The method also includes determining an instruction for operating the mobile device using the plurality of error indicators.

18 Claims, 17 Drawing Sheets

SYSTEM AND METHOD FOR OPERATING A MOBILE DEVICE HAVING A MAGNETOMETER USING ERROR INDICATORS

TECHNICAL FIELD

The following relates to systems and methods for operating a mobile device having a magnetometer.

BACKGROUND

A magnetometer is an instrument used to measure the strength and/or direction of the magnetic field in the vicinity of the instrument. Many electronic devices exist that utilize a magnetometer for taking measurements for a particular application, e.g. metal detectors, geophysical instruments, aerospace equipment, and mobile communications devices such as cellular telephones, PDAs, smart phones, tablet computers, etc., to name a few. For example, devices that comprise a magnetometer and have a display and processing capabilities, e.g., a smart phone, may include a compass application for showing a direction on the display.

Mobile communication devices, such as those listed above, typically operate in various different locations and under various circumstances. Changes in the environment in which the device operates can affect the operation of the magnetometer. Furthermore, magnetic interference moving with the mobile communication device and/or from components of the mobile communication device itself, such as components with hard iron, may affect the operation of the magnetometer. As such, the magnetometer may need to be calibrated at certain times.

BRIEF DESCRIPTION OF THE DRAWINGS

Embodiments will now be described by way of example only with reference to the appended drawings wherein.

DETAILED DESCRIPTION OF THE DRAWINGS

Figure 2:
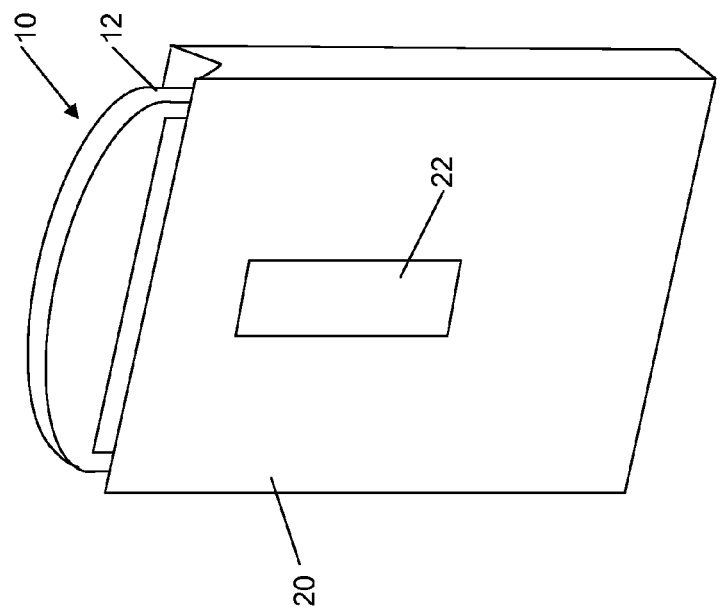
FIG. 2 is a perspective view of an example of a mobile device while holstered.

It will be appreciated that for simplicity and clarity of illustration, where considered appropriate, reference numerals may be repeated among the figures to indicate corresponding or analogous elements. In addition, numerous specific details are set forth in order to provide a thorough understanding of the example embodiments described herein. However, it will be understood by those of ordinary skill in the art that the example embodiments described herein may be practiced without these specific details. In other instances, well-known methods, procedures and components have not been described in detail so as not to obscure the example embodiments described herein. Also, the description is not to be considered as limiting the scope of the example embodiments described herein.

It has been found that certain types of magnetic interference move with a mobile device, thus subjecting a magnetometer of a mobile device to a constant, non-zero magnetic field in addition to the Earth's magnetic field. This magnetic interference may result in a constant bias or DC offset error in a magnetometer such that a magnetometer reading may not accurately indicate the Earth's magnetic field. A constant bias may affect one or more axes of the magnetometer. For example, a 3-axis magnetometer may have an offset in any one or more of the three magnetometer axes. The constant bias is the magnetometer axes' measurement point of intersection origin, and is usually non-zero, as the constant bias typically includes magnetic interference due to the net effect of hard iron inside a mobile device. As such, a calibration of the magnetometer can be performed to improve its accuracy by compensating for the effect of the constant bias.

In one aspect there is provided a method of operating a mobile device having a magnetometer. The method includes obtaining a plurality of error indicators associated with the magnetometer. At least two of the plurality of error indicators have different criteria for error. The method also includes determining an instruction for operating the mobile device using the plurality of error indicators.

In another aspect, there is provided a computer readable storage medium for operating a mobile device having a magnetometer. The computer readable storage medium includes computer executable instructions for obtaining a plurality of error indicators associated with the magnetometer. At least two of the plurality of error indicators have different criteria for error. The computer readable storage medium also includes computer executable instructions for determining an instruction for operating the mobile device using the plurality of error indicators.

In another aspect, there is provided a mobile device including a processor coupled to a memory and a magnetometer. The memory includes computer executable instructions for obtaining a plurality of error indicators associated with the magnetometer. At least two of the plurality of error indicators have different criteria for error. The memory also includes computer executable instructions for determining an instruction for operating the mobile device using the plurality of error indicators.

Although the following examples are presented in the context of mobile communication devices, the principles may equally be applied to other devices such as applications running on personal computers, embedded computing devices, other electronic devices, and the like.

For clarity in the discussion below, mobile communication devices are commonly referred to as "mobile devices" for brevity. Examples of applicable mobile devices include without limitation, cellular phones, cellular smart-phones, wireless organizers, pagers, personal digital assistants, computers, laptops, handheld wireless communication devices, wirelessly enabled notebook computers, portable gaming devices, tablet computers, or any other portable electronic device with processing and communication capabilities.

Figure 1:
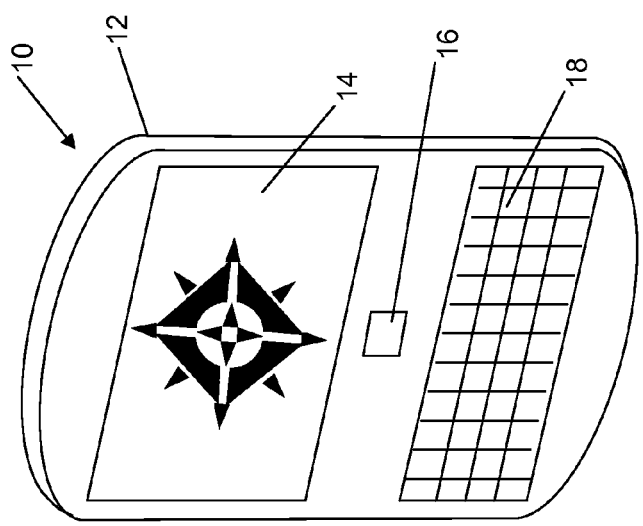
FIG. 1 is a perspective view of an example of a mobile device displaying an electronic compass.

An exterior view of an example mobile device 10 is shown in FIG. 1. The mobile device 10 in this example comprises a housing 12 which supports a display 14, a positioning device 16 (e.g. track pad, track ball, track wheel, etc.), and a keyboard 18. The keyboard 18 may comprise a full-Qwerty (as shown) set of keys but may also provide a reduced Qwerty set of keys (not shown) in other embodiments. FIG. 2 illustrates a complementary holster 20 for the mobile device 10. The holster 20 is typically used to stow and protect the outer surfaces of the housing 12, display 14, positioning device 16, keyboard 18, etc. and may be used to trigger other features such as a notification profile, backlight, phone answer/hang-up functions, etc. In this example, the holster 20 comprises a clip 22 to facilitate supporting the holster 20 and thus the mobile device 10 on a belt or other object.

Figure 4:
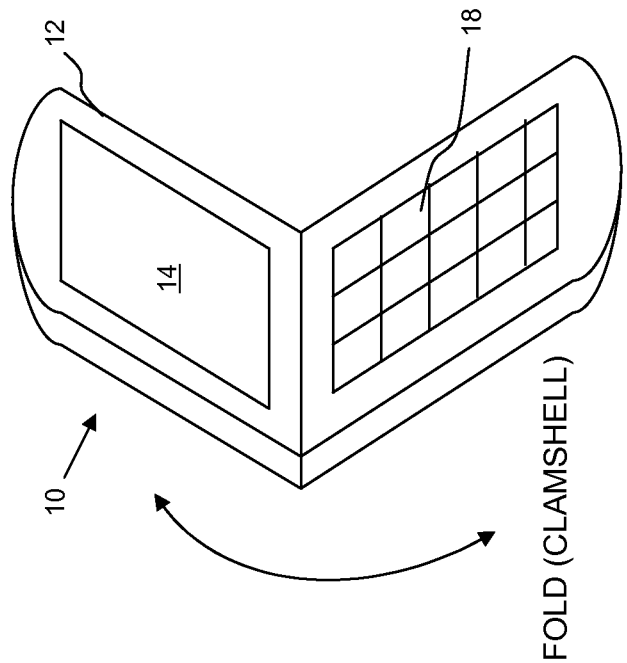
FIG. 4 is a perspective view of an example of a mobile device comprising a clamshell type foldable housing.
Figure 3:
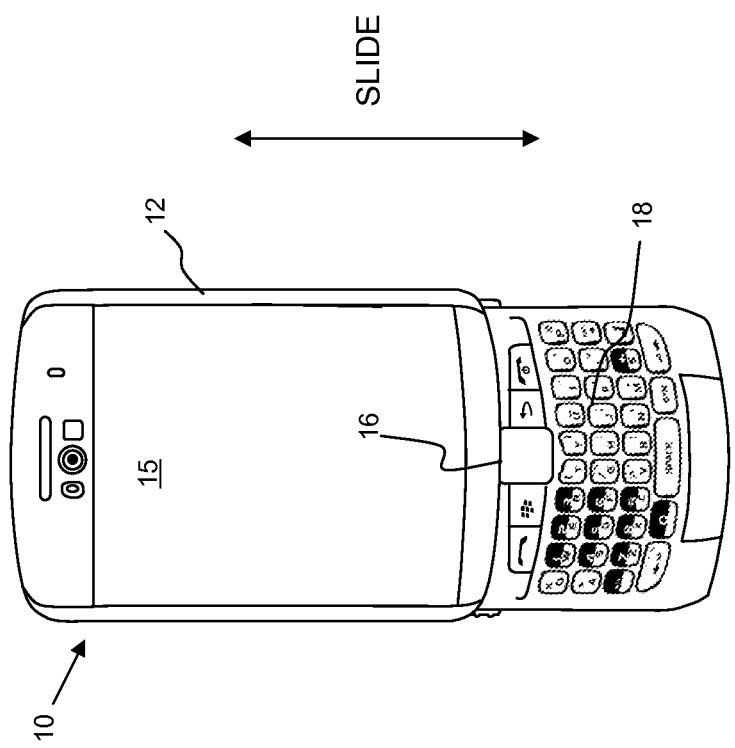
FIG. 3 is a perspective view of an example of a mobile device comprising a slidable keyboard assembly.

It can be appreciated that the mobile devices 10 shown in FIGS. 1 and 2 are provided as examples for illustrative purposes only. For example, FIG. 3 illustrates another mobile device 10, which comprises a touchscreen display 15 and a "slide-out" keyboard 18. In operation, the touchscreen display 15 can be used to interact with applications on the mobile device 10 and the keyboard 18 may be slid out from behind the touchscreen display 15 as shown, when desired, e.g. for typing or composing an email, editing a document, etc. FIG. 4 illustrates yet another example embodiment of a mobile device 10, wherein the housing 12 provides a foldable or flippable, clamshell type mechanism to fold the display 14 towards the keyboard 18 to effectively transition the mobile device 10 between an operable or open state and a standby or closed state. It can be appreciated that the clamshell type housing 12 as shown in FIG. 4 can be used to trigger an "answer" operation when changing from the closed state to the open state and, conversely, can trigger an "end" or "hang-up" operation when changing from the open state to the closed state.

The holstered state shown in FIG. 2 and the slide and folded states shown in FIGS. 3 and 4 illustrate that the mobile device 10 may assume various states depending on the type of device and its various features. As will be discussed below in greater detail, it has been recognized that magnetic effects can change or be otherwise influenced by the state of the mobile device 10, in particular when magnetic members (e.g. magnets) are used to detect or trigger a change in the operation of the mobile device 10 due to a change in configuration thereof. Since changing magnetic influences can affect a magnetometer and its accuracy, it has been found that changes in state of the mobile device 10 can be used to trigger a calibration of the magnetometer in order to compensate for different magnetic influences of the new state.

Figure 5:
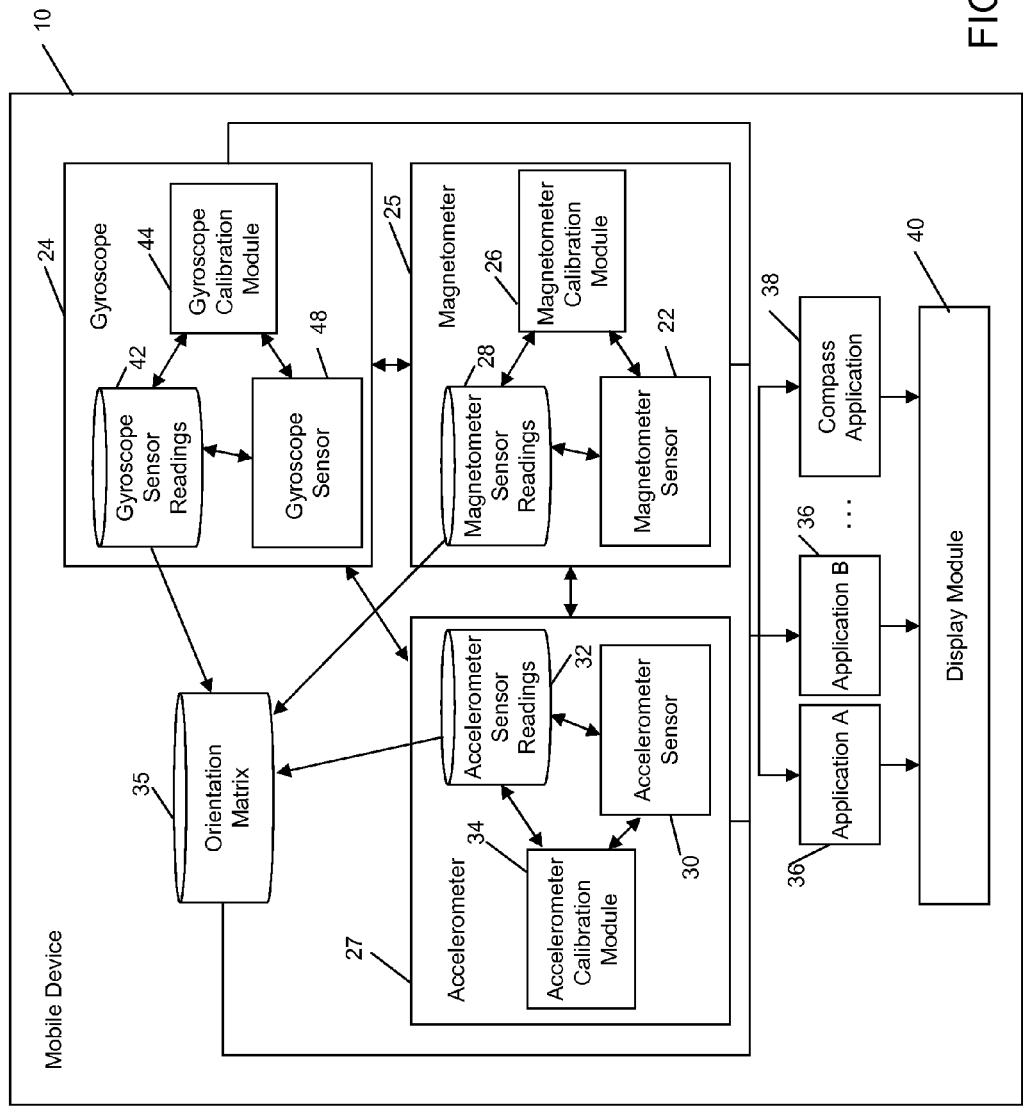
FIG. 5 is a block diagram of an example of a configuration for a mobile device comprising a magnetometer calibration module.

An example configuration for a mobile device 10 comprising a magnetometer 25 and an gyroscope 24 is shown in FIG. 5. It can be appreciated that various components of the mobile device 10 are omitted from FIG. 5 for ease of illustration. The magnetometer 25, when operable, obtains or otherwise acquires readings including the direction of the magnetic field and its strength using a magnetometer sensor 22. Such readings are stored in a magnetometer sensor readings data store 28. The magnetometer 25 in this example embodiment also comprises or otherwise has access to a magnetometer calibration module 26 which, as will be discussed below, can be used to calibrate the magnetometer sensor 22 to improve the quality of the magnetometer sensor readings 28.

Various ones of the applications 36 may also utilize the readings in the data store 28. In this example, a compass application 38 is shown specifically. It can be appreciated that the other applications 36 may include any application that can make use of magnetometer readings, for example, a stud finder application, metal detector application, augmented reality based application, etc. The applications 36, 38 may then use such readings to provide and/or update a user interface (UI) using a display module 40, e.g. a real-time compass showing the mobile device's heading as shown in FIG. 1.

The gyroscope 24, when operable, obtains or otherwise acquires readings including the rate of change of angular displacement with respect to time (i.e. angular velocity) of the mobile device 10 about an axis of the gyroscope 24 using a rotation or gyroscope sensor 48. Such readings are stored in a gyroscope sensor readings data store 42. The gyroscope 44 in this example embodiment also comprises or otherwise has access to a gyroscope calibration module 44 which can be used to calibrate the gyroscope sensor 48 to improve the quality of the gyroscope sensor readings 42. Various applications 36 may utilize the readings in the data store 42, e.g. text-based communication applications, gaming applications, etc. The applications 36 may then use such readings to provide and/or update a user interface (UI) using a display module 40. The gyroscope readings 42 can also be used by the magnetometer calibration module 26, as will be discussed below.

The mobile device 10 can also comprise an accelerometer 27. The accelerometer 27, when operable, obtains or otherwise acquires readings including the direction of the proper acceleration of the mobile device 10 and its magnitude, using an accelerometer sensor 30. Such readings are stored in an accelerometer sensor readings data store 32. The accelerometer 28 in this example also includes an accelerometer calibration module 34 for calibrating the accelerometer sensor 30 to compensate for gain and offset drifts to improve the accuracy of the accelerometer readings 32. Various applications 36 may utilize the readings in the data store 32, e.g. text-based communication applications, gaming applications, etc. The applications 36 may then use such readings to provide and/or update a user interface (UI) using a display module 40.

As shown in FIG. 5, the gyroscope 24, accelerometer 27 and magnetometer 25 may be operable to communicate with each other. It will be appreciated that the axes of the magnetometer 25, gyroscope 24 and/or accelerometer 27 may be aligned for convenience. In another example, the axes of each sensor may be different and the magnetometer 25, gyroscope 24 and accelerometer 27 may use readings of the other sensors by first transforming the readings into its coordinate system.

The mobile device 10 can also include an orientation matrix 35 which comprises a set of vectors used to determine the orientation of the mobile device 10 and changes in such orientation. In the example of FIG. 5, the orientation matrix 35 can be utilized or accessed by the magnetometer 25, accelerometer 27, and gyroscope 24, as well as various applications 36 and 38 to estimate the mobile device's orientation, changes in orientation, etc.

In one example, the orientation matrix 35 includes three vectors, referred to as "UP", "NORTH", and "EAST", each having respective x, y, and z coordinates. The UP vector can correspond to the accelerometer vector at rest. The NORTH and EAST vectors can be derived from cross products of the accelerometer and magnetometer vectors. The resultant vectors correspond to vectors which are perpendicular to both of the input vectors being multiplied and normal to the plane containing them. In this example, the EAST vector is obtained by taking the cross product of the magnetometer vector by the accelerometer vector (mag×accel) and the NORTH vector is obtained by taking the cross product of the accelerometer vector by the EAST vector (accel×EAST).

In another embodiment, the mobile device 10 can incorporate gyroscope readings from the gyroscope 24 of the mobile device 10 to compute the orientation matrix 35. For example, the mobile device 10 can update a previously computed orientation matrix 35 based on the angular movement of the mobile device 10 that has occurred since the previous orientation matrix 35 was computed, as detected by the gyroscope 24. This may be desirable if the mobile device 10 is experiencing linear acceleration such that the accelerometer vector is not aligned perfectly with the direction of the Earth's gravity and/or there is magnetic interference near the mobile device 10 such that the magnetometer reading does not consist only of the Earth's magnetic field. During such times, the accelerometer vector and/or magnetometer vector may be ignored and the gyroscope readings can be used to update a previous reliable orientation matrix 35. For example, a magnetometer 25 may need to access the UP vector. The magnetometer 25 can use the orientation matrix 35 to determine the UP vector instead of using the accelerometer vector at times when the accelerometer is determined not to be reliable.

Furthermore, the gyroscope 24 may be able to detect movements of the mobile device 10 more quickly to enable the orientation matrix 35 to be updated before additional magnetometer and/or accelerometer readings are available. It will be appreciated that a gyroscope 24 can be used in other ways to improve the accuracy of the orientation matrix 35 and to improve the robustness of the orientation matrix 35 against interferences that other sensors may be susceptible to, such as linear accelerations of the mobile device 10 and/or magnetic interference in the proximity of the mobile device 10.

Figure 6:
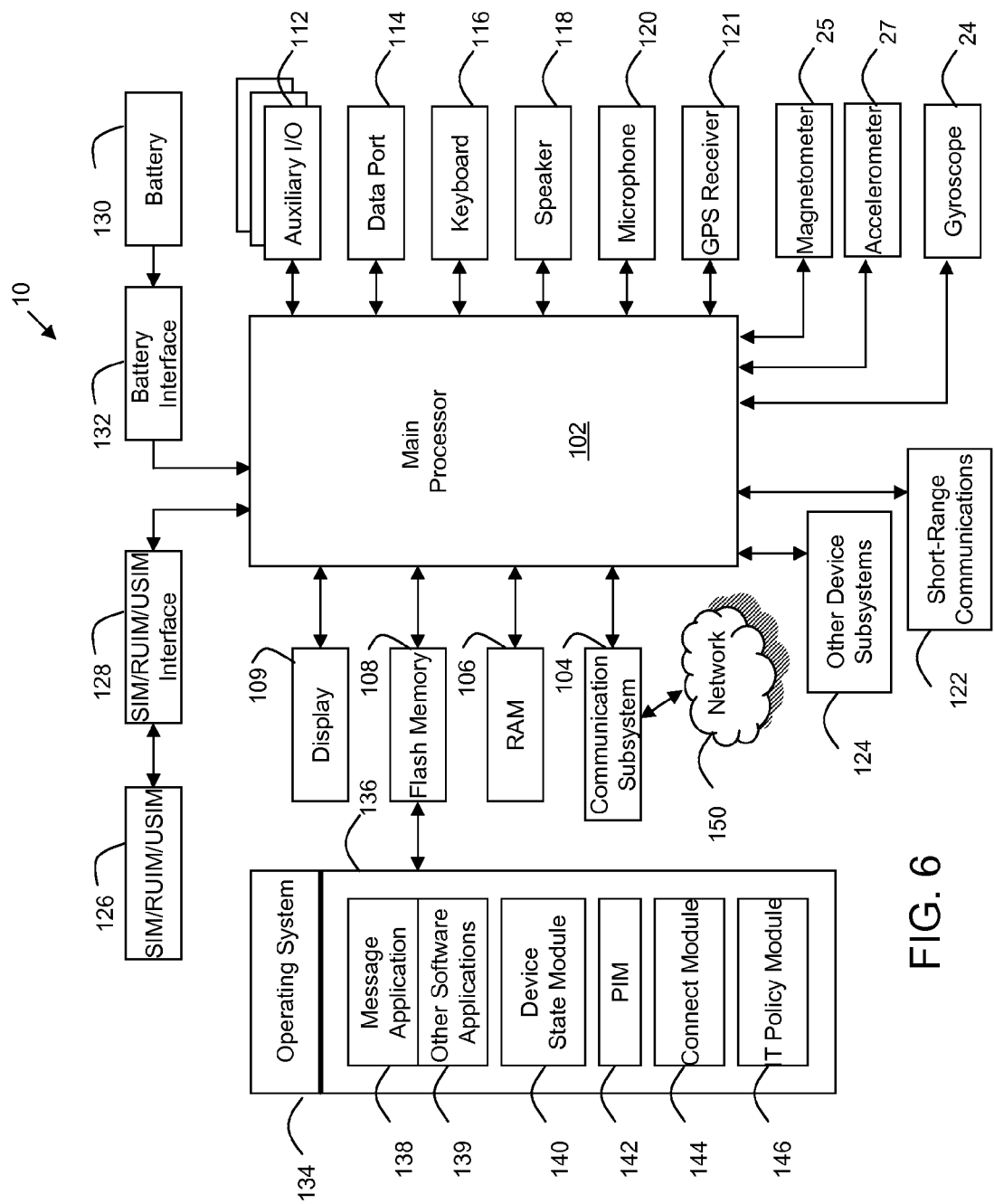
FIG. 6 is a block diagram of an example of a configuration for a mobile device.

Referring now to FIG. 6, shown therein is a block diagram of an example of an embodiment of a mobile device 10. The mobile device 10 comprises a number of components such as a main processor 102 that controls the overall operation of the mobile device 10. Communication functions, including data and voice communications, are performed through a communication subsystem 104. The communication subsystem 104 receives messages from and sends messages to a wireless network 150. In this example embodiment of the mobile device 10, the communication subsystem 104 is configured in accordance with the Global System for Mobile Communication (GSM) and General Packet Radio Services (GPRS) standards. The GSM/GPRS wireless network is used worldwide and it is expected that these standards will be superseded eventually by 3G and 4G networks such as EDGE, UMTS and HSDPA, LTE, Wi-Max etc. New standards are still being defined, but it is believed that they will have similarities to the network behaviour described herein, and it will also be understood by persons skilled in the art that the embodiments described herein are intended to use any other suitable standards that are developed in the future. The wireless link connecting the communication subsystem 104 with the wireless network 150 represents one or more different Radio Frequency (RF) channels, operating according to defined protocols specified for GSM/GPRS communications. With newer network protocols, these channels are capable of supporting both circuit switched voice communications and packet switched data communications.

The main processor 102 also interacts with additional subsystems such as a Random Access Memory (RAM) 106, a flash memory 108, a display 109, an auxiliary input/output (I/O) subsystem 112, a data port 114, a keyboard 116, a speaker 118, a microphone 120, GPS receiver 121, magnetometer 25, gyroscope 24, accelerometer 27, short-range communications 122, and other device subsystems 124.

Some of the subsystems of the mobile device 10 perform communication-related functions, whereas other subsystems may provide "resident" or on-device functions. By way of example, the display 109 and the keyboard 116 may be used for both communication-related functions, such as entering a text message for transmission over the network 150, and device-resident functions such as a calculator or task list.

The mobile device 10 can send and receive communication signals over the wireless network 150 after required network registration or activation procedures have been completed. Network access is associated with a subscriber or user of the mobile device 10. To identify a subscriber, the mobile device 10 may use a subscriber module. Examples of such subscriber modules include a Subscriber Identity Module (SIM) developed for GSM networks, a Removable User Identity Module (RUIM) developed for CDMA networks and a Universal Subscriber Identity Module (USIM) developed for 3G networks such as UMTS. In the example shown, a SIM/RUIM/USIM 126 is to be inserted into a SIM/RUIM/USIM interface 128 in order to communicate with a network. The SIM/RUIM/USIM component 126 is one type of a conventional "smart card" that can be used to identify a subscriber of the mobile device 10 and to personalize the mobile device 10, among other things. Without the component 126, the mobile device 10 may not be fully operational for communication with the wireless network 150. By inserting the SIM/RUIM/USIM 126 into the SIM/RUIM/USIM interface 128, a subscriber can access all subscribed services. Services may include: web browsing and messaging such as e-mail, voice mail, SMS, and MMS. More advanced services may include: point of sale, field service and sales force automation. The SIM/RUIM/USIM 126 includes a processor and memory for storing information. Once the SIM/RUIM/USIM 126 is inserted into the SIM/RUIM/USIM interface 128, it is coupled to the main processor 102. In order to identify the subscriber, the SIM/RUIM/USIM 126 can include some user parameters such as an International Mobile Subscriber Identity (IMSI). An advantage of using the SIM/RUIM/USIM 126 is that a subscriber is not necessarily bound by any single physical mobile device. The SIM/RUIM/USIM 126 may store additional subscriber information for a mobile device as well, including datebook (or calendar) information and recent call information. Alternatively, user identification information can also be programmed into the flash memory 108.

The mobile device 10 is typically a battery-powered device and may include a battery interface 132 for receiving one or more batteries 130 (typically rechargeable). In at least some embodiments, the battery 130 can be a smart battery with an embedded microprocessor. The battery interface 132 is coupled to a regulator (not shown), which assists the battery 130 in providing power to the mobile device 10. Although current technology makes use of a battery, future technologies such as micro fuel cells may provide the power to the mobile device 10.

The mobile device 10 also includes an operating system (OS) 134 and software components 136 to 146. The operating system 134 and the software components 136 to 146 that are executed by the main processor 102 are typically stored in a persistent store such as the flash memory 108, which may alternatively be a read-only memory (ROM) or similar storage element (not shown). Those skilled in the art will appreciate that portions of the operating system 134 and the software components 136 to 146, such as specific device applications, or parts thereof, may be temporarily loaded into a volatile store such as the RAM 106. Other software components can also be included, as is well known to those skilled in the art.

The subset of software applications 136 that control basic device operations, including data and voice communication applications, may be installed on the mobile device 10 during its manufacture. Other software applications include a message application 138 that can be any suitable software program that allows a user of the mobile device 10 to send and receive electronic messages. Various alternatives exist for the message application 138 as is well known to those skilled in the art. Messages that have been sent or received by the user are typically stored in the flash memory 108 of the mobile device 10 or some other suitable storage element in the mobile device 10. In at least some embodiments, some of the sent and received messages may be stored remotely from the mobile device 10 such as in a data store of an associated host system that the mobile device 10 communicates with.

The software applications can further comprise a device state module 140, a Personal Information Manager (PIM) 142, and other suitable modules (not shown). The device state module 140 provides persistence, i.e. the device state module 140 ensures that important device data is stored in persistent memory, such as the flash memory 108, so that the data is not lost when the mobile device 10 is turned off or loses power.

The PIM 142 includes functionality for organizing and managing data items of interest to the user, such as, but not limited to, e-mail, contacts, calendar events, voice mails, appointments, and task items. A PIM application has the ability to send and receive data items via the wireless network 150. PIM data items may be seamlessly integrated, synchronized, and updated via the wireless network 150 with the mobile device subscriber's corresponding data items stored and/or associated with a host computer system. This functionality creates a mirrored host computer on the mobile device 10 with respect to such items. This can be particularly advantageous when the host computer system is the mobile device subscriber's office computer system.

The mobile device 10 may also comprise a connect module 144, and an IT policy module 146. The connect module 144 implements the communication protocols that are required for the mobile device 10 to communicate with the wireless infrastructure and any host system, such as an enterprise system, that the mobile device 10 is authorized to interface with.

The connect module 144 includes a set of APIs that can be integrated with the mobile device 10 to allow the mobile device 10 to use any number of services associated with the enterprise system. The connect module 144 allows the mobile device 10 to establish an end-to-end secure, authenticated communication pipe with a host system (not shown). A subset of applications for which access is provided by the connect module 144 can be used to pass IT policy commands from the host system to the mobile device 10. This can be done in a wireless or wired manner. These instructions can then be passed to the IT policy module 146 to modify the configuration of the device 10. Alternatively, in some cases, the IT policy update can also be done over a wired connection.

The IT policy module 146 receives IT policy data that encodes the IT policy. The IT policy module 146 then ensures that the IT policy data is authenticated by the mobile device 100. The IT policy data can then be stored in the flash memory 106 in its native form. After the IT policy data is stored, a global notification can be sent by the IT policy module 146 to all of the applications residing on the mobile device 10. Applications for which the IT policy may be applicable then respond by reading the IT policy data to look for IT policy rules that are applicable.

Other types of software applications or components 139 can also be installed on the mobile device 10. These software applications 139 can be pre-installed applications (i.e. other than message application 138) or third party applications, which are added after the manufacture of the mobile device 10. Examples of third party applications include games, calculators, utilities, etc.

The additional applications 139 can be loaded onto the mobile device 10 through at least one of the wireless network 150, the auxiliary I/O subsystem 112, the data port 114, the short-range communications subsystem 122, or any other suitable device subsystem 124. This flexibility in application installation increases the functionality of the mobile device 10 and may provide enhanced on-device functions, communication-related functions, or both. For example, secure communication applications may enable electronic commerce functions and other such financial transactions to be performed using the mobile device 10.

The data port 114 enables a subscriber to set preferences through an external device or software application and extends the capabilities of the mobile device 10 by providing for information or software downloads to the mobile device 10 other than through a wireless communication network. The alternate download path may, for example, be used to load an encryption key onto the mobile device 10 through a direct and thus reliable and trusted connection to provide secure device communication.

The data port 114 can be any suitable port that enables data communication between the mobile device 10 and another computing device. The data port 114 can be a serial or a parallel port. In some instances, the data port 114 can be a USB port that includes data lines for data transfer and a supply line that can provide a charging current to charge the battery 130 of the mobile device 10.

The short-range communications subsystem 122 provides for communication between the mobile device 10 and different systems or devices, without the use of the wireless network 150. For example, the subsystem 122 may include an infrared device and associated circuits and components for short-range communication. Examples of short-range communication standards include standards developed by the Infrared Data Association (IrDA), Bluetooth, and the 802.11 family of standards developed by IEEE.

In use, a received signal such as a text message, an e-mail message, or web page download may be processed by the communication subsystem 104 and input to the main processor 102. The main processor 102 may then process the received signal for output to the display 109 or alternatively to the auxiliary I/O subsystem 112. A subscriber may also compose data items, such as e-mail messages, for example, using the keyboard 116 in conjunction with the display 109 and possibly the auxiliary I/O subsystem 112. The auxiliary subsystem 112 may comprise devices such as: a touch screen, mouse, track ball, infrared fingerprint detector, or a roller wheel with dynamic button pressing capability. The keyboard 116 is an alphanumeric keyboard and/or telephone-type keypad. However, other types of keyboards may also be used. A composed item may be transmitted over the wireless network 150 through the communication subsystem 104.

For voice communications, the overall operation of the mobile device 10 in this example is substantially similar, except that the received signals are output to the speaker 118, and signals for transmission are generated by the microphone 120. Alternative voice or audio I/O subsystems, such as a voice message recording subsystem, can also be implemented on the mobile device 10. Although voice or audio signal output is accomplished primarily through the speaker 118, the display 109 can also be used to provide additional information such as the identity of a calling party, duration of a voice call, or other voice call related information.

It will be appreciated that any module or component exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the mobile device 10 (or other computing or communication device that utilizes similar principles) or accessible or connectable thereto. Any application or module herein described, such as the calibration modules 26, 34 and 44 for example, may be implemented using computer readable/executable instructions that may be stored or otherwise held by such computer readable media.

Figure 7:
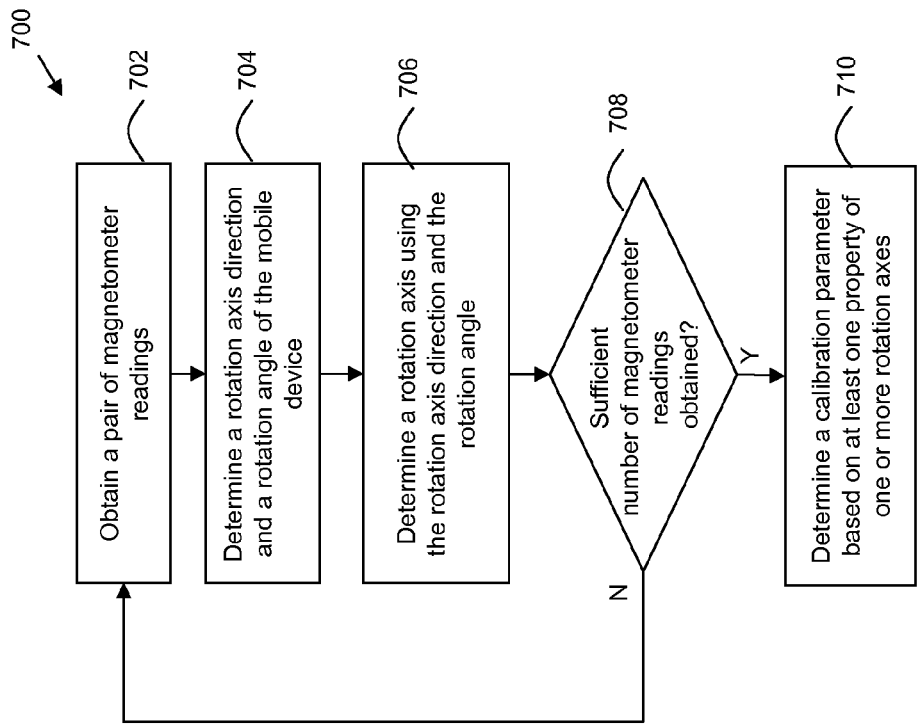
FIG. 7 is a flow chart including an example of a set of computer executable operations for calibrating a magnetometer on a mobile device.

As mentioned above, a magnetometer 25 of a mobile device 10 may be subject to a constant bias or DC offset error. FIG. 7 illustrates an example of a set of computer executable operations 700 for calibrating a magnetometer 25 on a mobile device 10 to address the constant bias. In an example configuration of the mobile device 10 of FIG. 5, the magnetometer calibration 700 may be executed by the magnetometer calibration module 26. At 702, a pair of magnetometer readings is obtained. At 704, a rotation axis direction and a rotation angle corresponding to a change in an orientation of the mobile device 10 are determined. At 706, a rotation axis is determined using the rotation axis direction and the rotation angle. At 708, a check is performed to determine whether a sufficient number of magnetometer readings has been obtained. If a sufficient number of magnetometer readings has not been obtained, 702 to 706 are repeated. In one example, two pairs of magnetometer readings (i.e. a minimum of three unique magnetometer readings) are used to perform the magnetometer calibration 700. Once a sufficient number of magnetometer readings are obtained, at 710, a calibration parameter is determined based on at least one property of one or more rotation axes.

Figure 8:
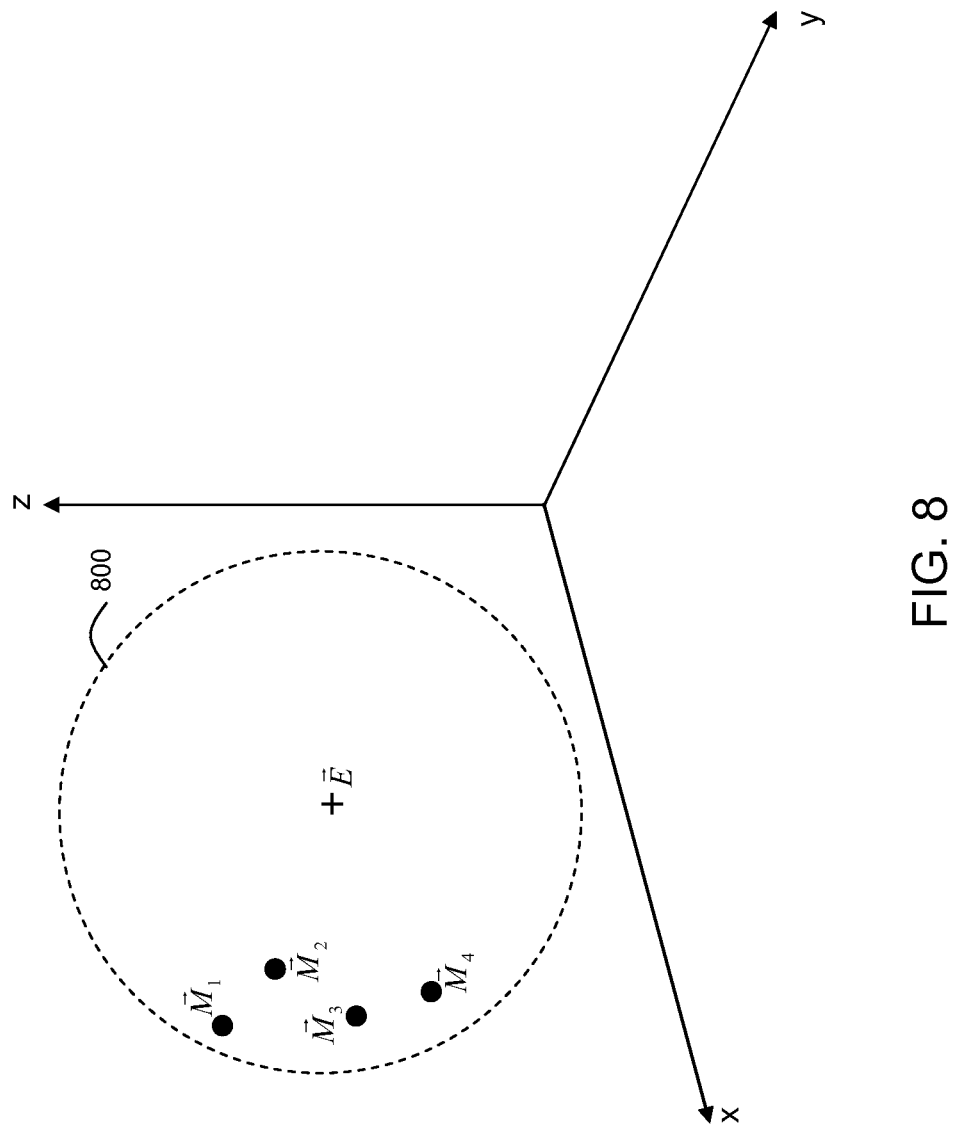
FIGS. 8 to 13 are example data point graphs for illustrating the operations of an example calibration of a magnetometer.

The example magnetometer calibration 700 will be described with reference to the example data point graphs of FIGS. 8-12. As shown in FIG. 8, a magnetometer 25 of a mobile device 10 may obtain successive magnetometer readings, $\vec{M}_1=(x_1,y_1,z_1)$, $\vec{M}_2=(x_2,y_2,z_2)$, $\vec{M}_3=(x_3,y_3,z_3)$ and $\vec{M}_4=(x_4,y_4,z_4)$, as defined by the xyz co-ordinate system of the magnetometer 25, as the mobile device 10 changes orientation. The magnetometer 25 may also be subject to a constant bias $\vec{E}=(x_e,y_e,z_e)$ such that the magnetometer readings $\vec{M}_1$ to a $\vec{M}_4$ lie generally on the surface of a sphere 800 having a centre at the constant bias $\vec{E}$.

As noted above, at 702, a pair of magnetometer readings is obtained. In the example configuration of the mobile device 10 of FIG. 5, the magnetometer calibration module 26 can obtain magnetometer readings, such as $\vec{M}_1$ and $\vec{M}_2$, from the magnetometer readings data store 28. The magnetometer reading $\vec{M}_1$ is obtained first, and then after a sample period, magnetometer reading $\vec{M}_2$ is obtained. The change from magnetometer reading $\vec{M}_1$ to $\vec{M}_2$ reflects a corresponding change in the orientation of the mobile device 10.

At 704, a rotation axis direction and a rotation angle are determined. The rotation axis direction and rotation angle correspond to the change in orientation of the mobile device 10 between obtaining the first magnetometer reading and obtaining the second magnetometer reading of the pair of magnetometer readings. In the example configuration of the mobile device 10 of FIG. 5, the magnetometer calibration module 26 can obtain the rotation axis direction and rotation angle from a rotational sensor such as the gyroscope 24. Obtaining the rotation axis and rotation angle from the gyroscope 24 can help avoid or reduce the effects of inaccuracies in the magnetometer 25 by minimizing its use in obtaining these parameters.

Figure 9:
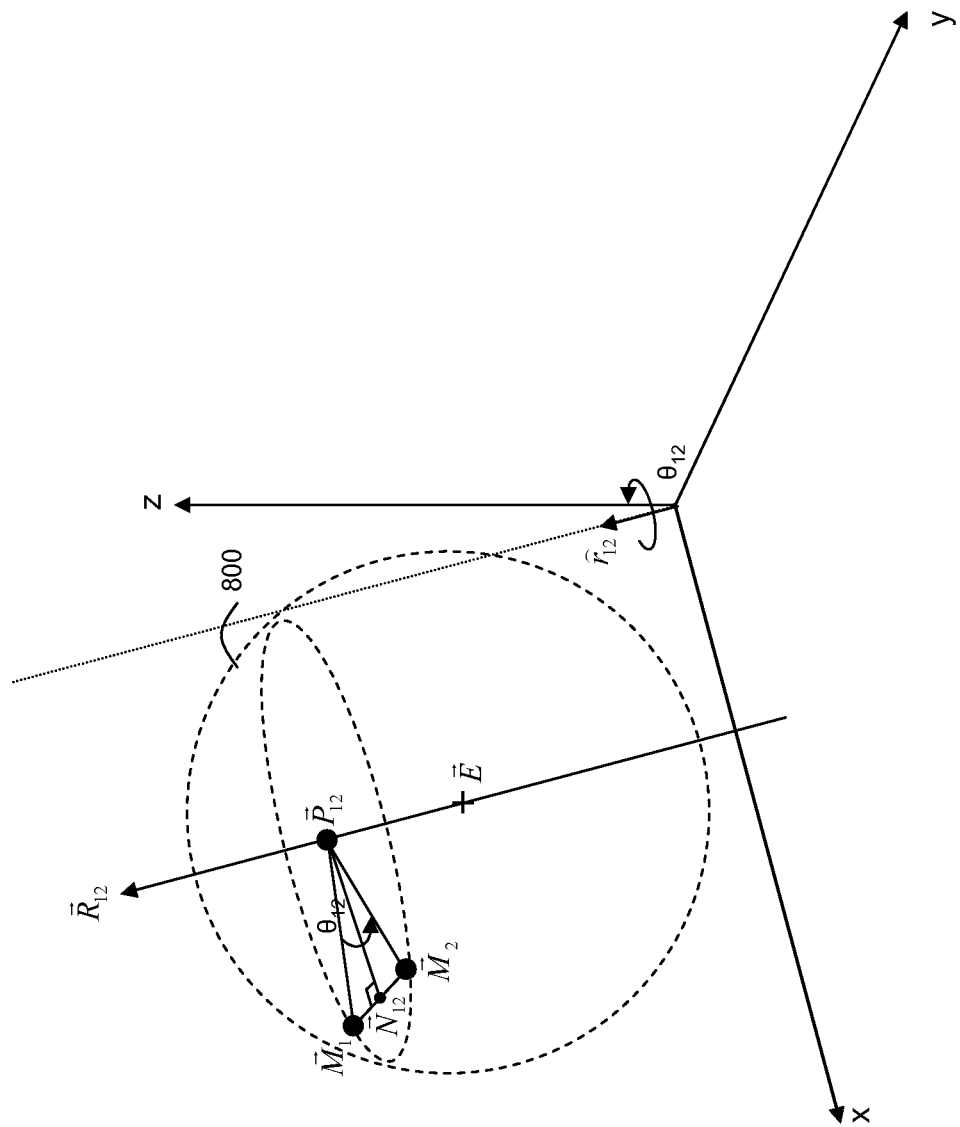

In the example of FIG. 9, the rotation axis direction $\hat{r}_{12}=(x_{12},y_{12},z_{12})$ and rotation angle $\theta_{12}$ correspond to the change in orientation of the mobile device 10 from obtaining magnetometer reading $\vec{M}_1$ to obtaining magnetometer reading $\vec{M}_2$. The change in orientation is specified as a rotation of the mobile device 10 about an axis in the direction $\hat{r}_{12}$ by the rotation angle $\theta_{12}$.

In one example, the gyroscope 24 may provide the rotational information of the mobile device 10 in the form of an axis-angle representation comprising the rotation axis direction $\hat{r}_2$ and the rotation angle $\theta_{12}$, or such information may be derived from measurements obtained by the gyroscope sensor 48. For example, $\theta_{12}$ can be obtained by integrating the angular velocity about each axis of the gyroscope sensor 48 over the time period between obtaining the first magnetometer reading $\vec{M}_1$ and the second magnetometer reading $\vec{M}_2$.

At 706, a rotation axis $\vec{R}_{12}$ is determined using the rotation axis direction $\hat{r}_2$ and rotation angle $\theta_{12}$. As a mobile device 10 changes orientation (i.e. rotates) in a substantially constant magnetic field, the magnetic field rotates with respect to the mobile device 10 in a corresponding manner. Therefore, the magnetometer reading $\vec{M}_2$ can be modelled as a rotation of the magnetometer reading $\vec{M}_1$ about an axis $\vec{R}_{12}$ by the rotation angle $\theta_{12}$, where the axis $\vec{R}_{12}$ is in the direction of the rotation axis direction $\hat{r}_2$ and passing through the constant bias $\vec{E}$. The rotation axis $\vec{R}_{12}$ can be determined as a line in the direction of the rotation axis direction $\hat{r}_{12}$ such that the angle between the first magnetometer reading $\vec{M}_1$, and the second magnetometer reading $\vec{M}_2$ about the rotation axis $\vec{R}_{12}$ is equal to $\theta_{12}$.

In one example, the magnetometer calibration module 26 can determine the rotation axis $\vec{R}_{12}$ by performing the following operations:

computing the midpoint $\vec{N}_{12}$ between the pair of magnetometer readings $\vec{M}_1$ and $\vec{M}_2$ as $\vec{N}_{12}=(\vec{M}_1-\vec{M}_2)/2+\vec{M}_2$;

computing the direction $\hat{u}_{12}$ towards the rotation axis $\vec{R}_{12}$, perpendicular to both the rotation axis direction $\hat{r}_2$ and the line connecting $\vec{M}_1$ and $\vec{M}_2$, as the unit vector $\hat{u}_{12}$ of $(\vec{M}_1 - \vec{M}_2) \times \hat{r}_2$, where × represents that cross product operation;

computing the distance $U_{12}$ along the direction $\hat{u}_{12}$ from $\vec{N}_{12}$ towards the rotation axis $\vec{R}_{12}$ as $U_{12}$=distance($\vec{M}_1$, $\vec{N}_{12}$)/tan($\theta_{12}$/2), where distance($\vec{M}_1$, $\vec{N}_{12}$) is the distance between point $\vec{M}_1$ and $\vec{N}_{12}$; and computing the point $\vec{P}_2$ as $\vec{P}_{12} = \vec{N}_{12} + U_{12} * \hat{U}_{12}$.

The rotation axis $\vec{R}_{12}$ is defined as the line that passes through point $\vec{P}_2$ and extends in the direction of the rotation axis direction $\hat{r}_2$. As shown in FIG. 9, the rotation axis $\vec{R}_{12}$ passes through both $\vec{P}_2$ and the constant bias $\vec{E}$.

Figure 10:
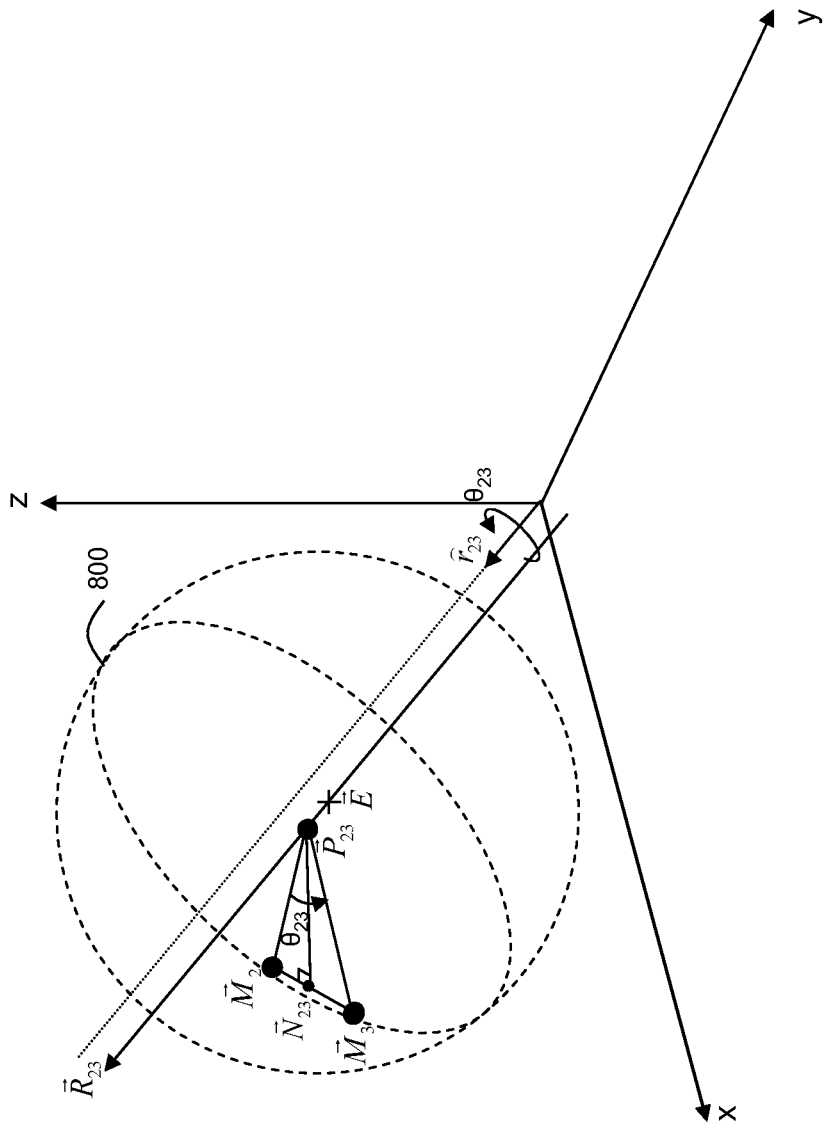

At 708, the magnetometer calibration 700 checks whether a sufficient number of magnetometer readings have been obtained. In one example, the magnetometer calibration 700 requires a minimum of two pairs of magnetometer readings and thus 702 to 706 are repeated to obtain $\vec{M}_3$, thus also obtaining another pair of magnetometer readings comprising $\vec{M}_2$ and $\vec{M}_3$ (FIG. 10). The rotation axis direction $\hat{r}_{23}$ and rotation angle $\theta_{23}$ can be obtained from the gyroscope 24. The rotation axis $\vec{R}_{23}$ is defined as the line that passes through point $\vec{P}_{23}$ and extends in the direction of the rotation axis direction $\hat{r}_{23}$, where $\vec{P}_{23} = \vec{N}_{23} + U_{23} * \hat{U}_{23}$, $\vec{N}_{23} = (\vec{M}_2 - \vec{M}_3)/2 + \vec{M}_3$, $U_{23} = (\vec{M}_2, \vec{N}_{23})/\tan(\theta_{23}/2)$, and $\hat{U}_{12}$ equals the unit vector of $(\vec{M}_2 - \vec{M}_3) \times \hat{r}_{23}$. As shown in FIG. 10, the rotation axis $\vec{R}_2$ also passes through $\vec{P}_{23}$ and the constant bias $\vec{E}$.

Figure 11:
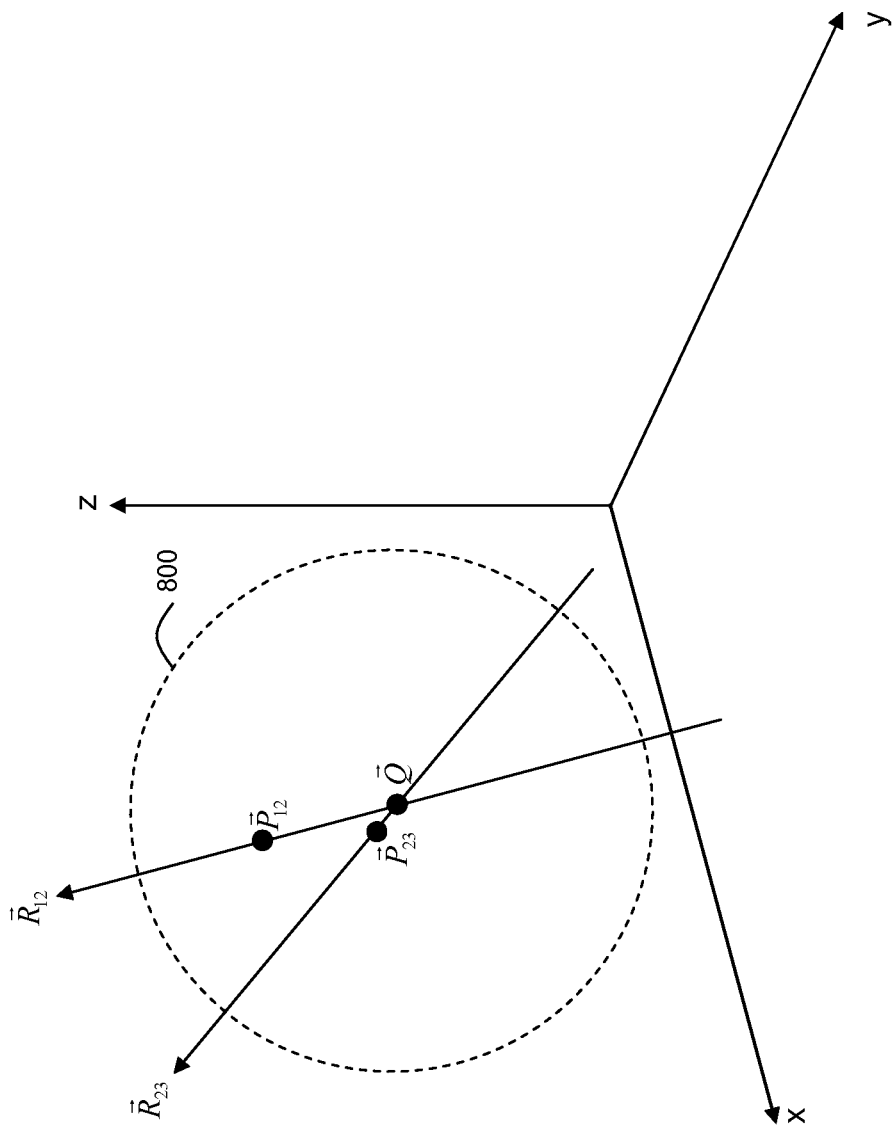

At 710, a calibration parameter based on at least one property of one or more rotation axes is determined. For example, as noted above, the rotation axes $\vec{R}_{12}$ and $\vec{R}_2$ both pass through the constant bias $\vec{E}$. In this example, the intersection point of two or more rotation axes, such as intersection point $\vec{Q}$ of rotation axes $\vec{R}_{12}$ and $\vec{R}_2$, can be used as the calibration parameter, representing the constant bias $\vec{E}$ of the magnetometer 25 (FIG. 11). Therefore, it can be seen that the magnetometer calibration 700 can determine a calibration parameter indicative of the constant bias $\vec{E}$ after taking only 3 magnetometer readings.

Figure 12:
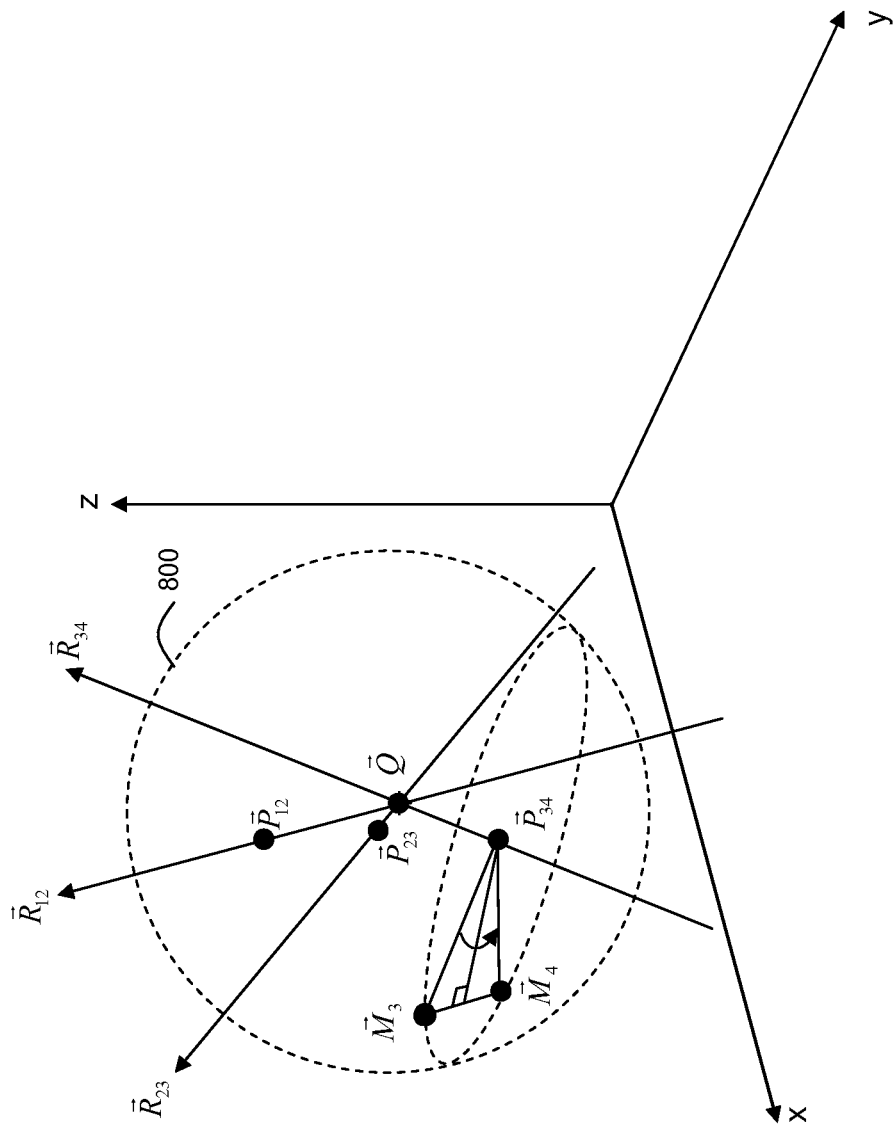

It will be appreciated that the magnetometer calibration 700 can continue to be applied to subsequent magnetometer readings, such as $\vec{M}_4$ to generate point $\vec{P}_{34}$ and rotation axis $\vec{R}_{34}$ (FIG. 12). The rotation axes $\vec{R}_{34}$ may intersect $\vec{R}_{12}$ and intersect $\vec{R}_{23}$ to generate respective calibration parameters at the intersection points. In the example of FIG. 12, all three rotation axes $\vec{R}_{12}$, $\vec{R}_{23}$ and $\vec{R}_{34}$ intersect at point $\vec{Q}$. A reoccurring intersection point may suggest higher quality calibration.

Figure 13:
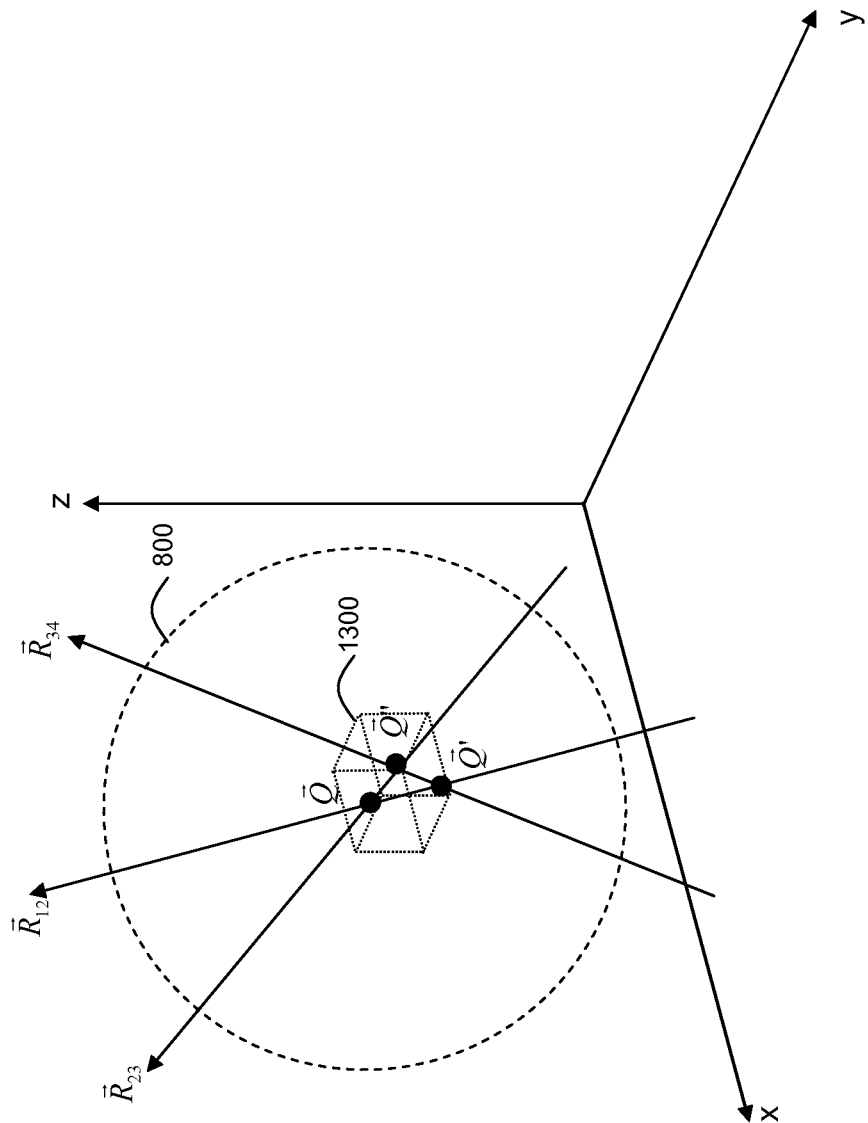

One or more rotation axes may intersect at a point different than that of another pair of rotation axes. For example, $\vec{R}_{34}$ may intersect $\vec{R}_{12}$ and $\vec{R}_{23}$ at points $\vec{Q}'$ and $\vec{Q}''$, respectively, while $\vec{R}_{12}$ and $\vec{R}_{23}$ intersect at point $\vec{Q}$ (FIG. 13). In another example, one or more rotation axes may not interest with other rotation axes (not shown). When two rotation axes do not interest, the magnetometer calibration module 26 may use a point indicative of where the rotation axes are close together, such as a point on of the rotation axis that is at the minimum distance to the other rotation axis or the midpoint of the shortest path between both rotation axes. Different intersection points or an absence of intersection points may be due to noise and/or other errors (such as gain and inter-axis misalignment) affecting the magnetometer readings.

In one example, the magnetometer calibration module 26 may use each point indicative of proximity between two or more rotation axes, herein referred to as a "proximity point", as an updated value of the calibration parameter. In another example, the magnetometer calibration module 26 may average, combine or otherwise incorporate one or more proximity points generated from three or more magnetometer readings to generate a calibration parameter. Using more proximity points to determine a calibration parameter can improve the quality or confidence of the calibration. A proximity point may include a point on a rotation axis that is at the minimum distance to another rotation axis, such as the intersection point between two rotation axes or the midpoint along the shortest path between two rotation axes.

It can be seen that, after obtaining a sufficient number of magnetometer readings, each additional magnetometer reading, along with its previous magnetometer reading, may be used to determine a rotation axis from which a proximity point can be determined. The proximity point may be used by itself or combined with previously determined proximity points to generate a calibration parameter. In another example, a magnetometer reading may be discarded as unreliable if the proximity point generated using such magnetometer reading differs by a predetermined threshold from, or does not otherwise satisfy criteria involving, previously generated proximity points.

As will be discussed in further detail below, the quality of the magnetometer calibration 700 may be evaluated based on one or more properties of a "cluster", where a cluster is defined as a space around two or more proximity points, such as the cluster 1300 enclosing intersection points $\vec{Q}$, $\vec{Q}'$ and $\vec{Q}''$ (FIG. 13). The cluster 1300 can have the shape of a rectangular parallelepiped (as shown), an ellipsoid or another shape. Various criteria may be used to define the points within the cluster, such as all the proximity points generated, a standard deviation or percentile of the proximity points or other selection criteria.

Figure 14:
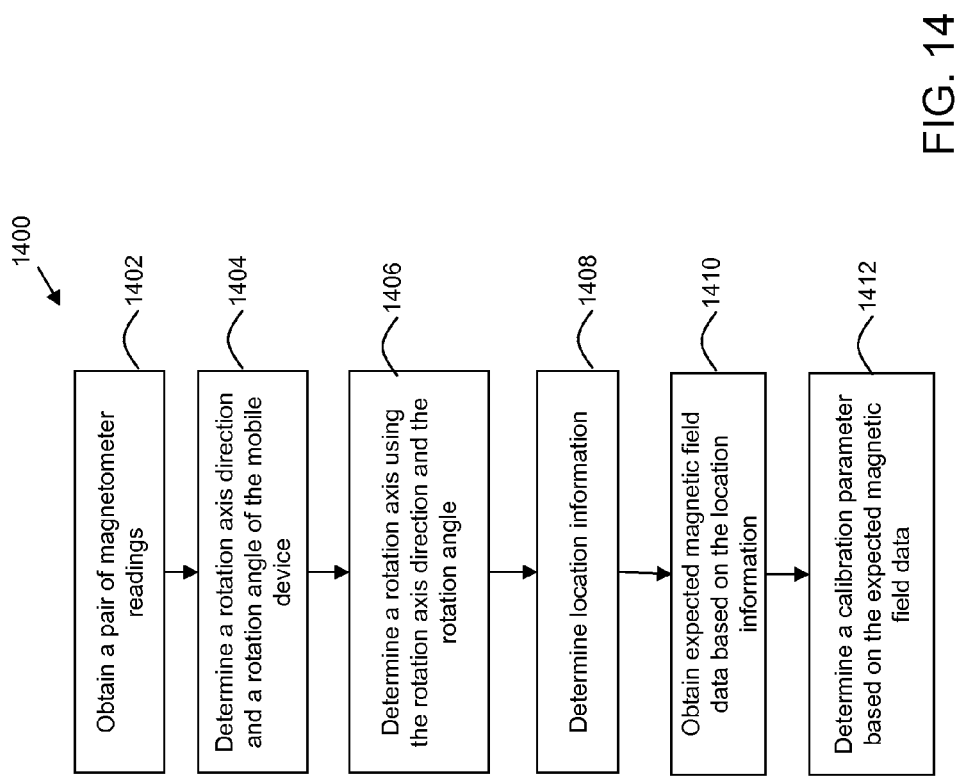
FIG. 14 is a flow chart including another example of a set of computer executable operations for calibrating a magnetometer on a mobile device.

FIG. 14 illustrates another example of a set of computer executable operations 1400 for calibrating a magnetometer 25 on a mobile device 10. In an example configuration of the mobile device 10 of FIG. 5, the example magnetometer calibration 1400 may be executed by the magnetometer calibration module 26. At 1402, a pair of magnetometer readings is obtained. At 1404, a rotation axis direction and a rotation angle corresponding to a change in orientation of the mobile device 10 are determined. At 1406, a rotation axis is determined using the rotation axis direction and the rotation angle. At 1408, location information of the mobile device 10 is determined. At 1410, expected magnetic field data is obtained based on the location information of the mobile device 10. At 1412, a calibration parameter is determined based on the expected magnetic field data.

Operations 1402, 1404, 1406 are substantially similar to 702, 704 and 706 described above.

At 1408, location information of the mobile device 10 is determined. In one example, the magnetometer calibration module 26 can obtain location information (e.g. latitude, longitude and elevation) from a GPS receiver 121 of the mobile device 10. It can be appreciated that location information of the mobile device 10 can be obtained using cell-site geolocation, WiFi localization, current timezone, contextual information (e.g. calendar appointment location), cache of location history, user input of location information or other techniques or data made available to the mobile device 10.

At 1410, expected magnetic field data is obtained based on the location information of the mobile device 10. In one example, the magnetometer calibration module 26 can obtain expected magnetic field data from a data model of the Earth's magnetic field, such as the World Magnetic Model (WMM). The data model may be accessed by the mobile device 10 remotely (e.g. via a communication subsystem 104 connected to a network 150) or locally (e.g. a software application 139 running on the mobile device 10).

It will be appreciated that the data model of the Earth's magnetic field can be any suitable model that takes location information as an input, and outputs the expected magnetic field or magnetic field data. For example, the data model may be a database, indexed by location on the Earth, of pre-computed magnetic field data or measured magnetic field data or a combination thereof. In another example, the data model may include a set of mathematical computations that operate on the location information provided by the mobile device 10.

In this example, at 1410, information regarding the location of the mobile device 10, such as latitude, longitude and elevation, along with additional information such as the date, is input to the data model to obtain information on the expected magnetic field, including its magnitude $|\vec{F}|$ and inclination angle.

Figure 15:
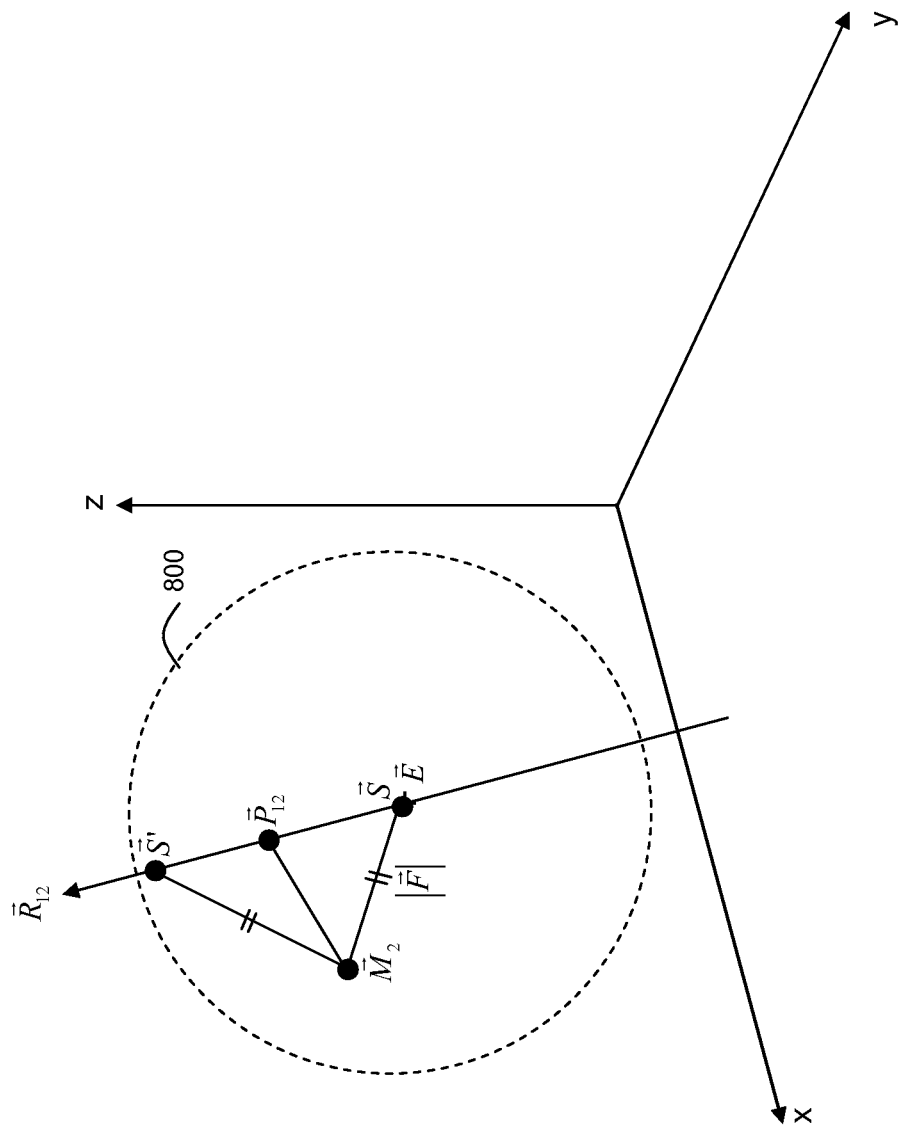
FIG. 15 is an example data point graph for illustrating the operations of another example calibration of a magnetometer.

At 1412, a calibration parameter based on the expected magnetic field data is determined. As mentioned above at 702 of the magnetometer calibration 700, the magnetometer reading $\vec{M}_2$ can be modelled as a rotation of the magnetometer reading $\vec{M}_1$ about the rotation axis $\vec{R}_{12}$ by the rotation angle $\theta_{12}$, where the axis $\vec{R}_{12}$ passes through the constant bias $\vec{E}$. Having generated the rotation axis $\vec{R}_{12}$ at 1408, the expected magnetic field data may be used to select a point on the rotation axis $\vec{R}_{12}$ as the calibration parameter (FIG. 15). For example, the calibration parameter may be determined as a point having a distance from $\vec{M}_2$ equal to the expected magnitude of the Earth's magnetic field $|\vec{F}|$ that lies on the rotation axis $\vec{R}_{12}$ (i.e. points $\vec{S}$ or $\vec{S}'$). From points $\vec{S}$ or $\vec{S}'$, the calibration parameter can be chosen as the point that, when subtracted from $\vec{M}_2$ (i.e. either $\vec{M}_2-\vec{S}$ or $\vec{M}_2-\vec{S}'$), has an inclination angle equal or closer to the expected inclination angle obtained from the data model, thus resulting in only one solution satisfying the above criteria. In the example of FIG. 15, $\vec{S}$ satisfies the above criteria and can be chosen as the calibration parameter.

In one example, the inclination angle of $\vec{M}_2-\vec{S}$ can be computed as 90° minus the angle between $\vec{M}_2-\vec{S}$ and the DOWN vector representing the direction of gravity. The DOWN vector can be determined as the vector in the opposite direction of the accelerometer vector obtained by the accelerometer 27 of the mobile device 10 at rest or the third row of the orientation matrix 35, or using other techniques or data available to the mobile device 10. The inclination angle of $\vec{M}_2-\vec{S}'$ may be computed in a similar manner.

It can be seen that the magnetometer calibration 1400 can use small movements of the mobile device 10 that only provides two unique magnetometer readings, to calibrate the magnetometer 25. This may enable to mobile device 10 to calibrate the magnetometer 25 when other magnetometer calibrations, such as magnetometer calibration 700, can not be performed for lack of a sufficient number of unique magnetometer readings.

Referring back FIG. 13, the quality of a magnetometer calibration, such as magnetometer calibration 700, may be evaluated based on one or more properties of a cluster 1300, enclosing one or more proximity points determined during the magnetometer calibration.

Figure 16:
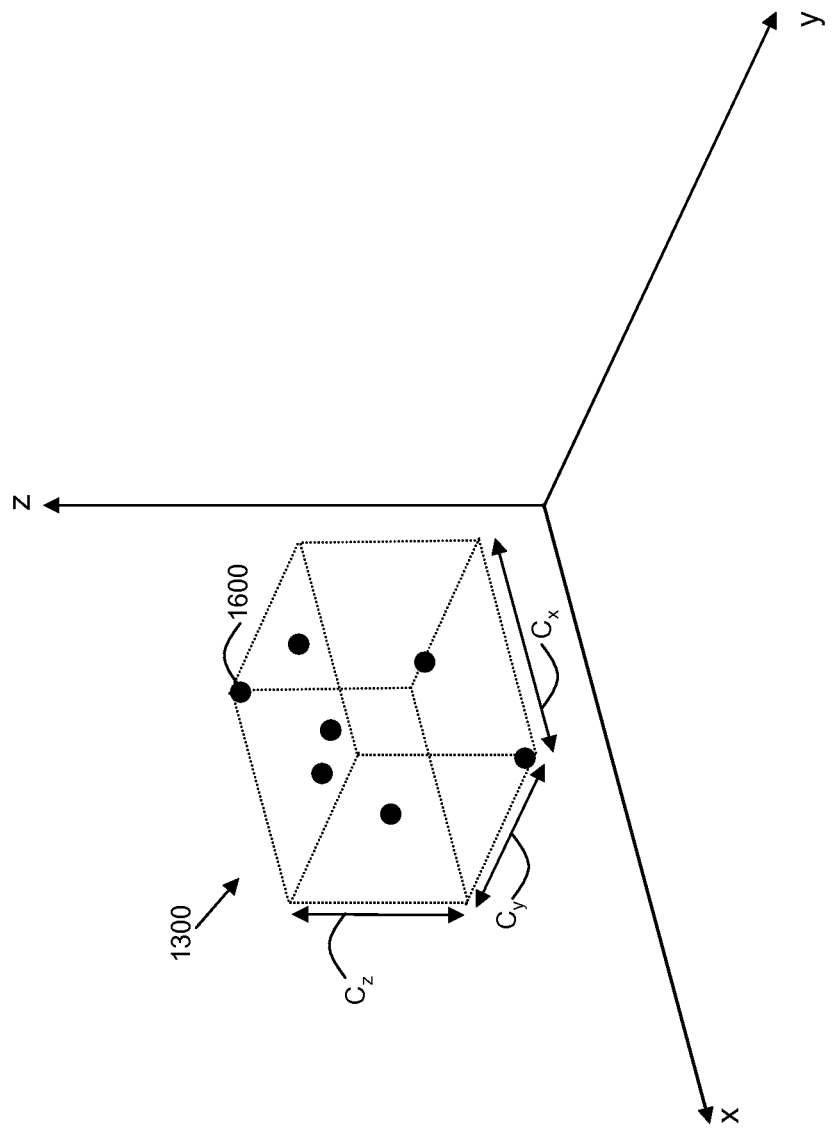
FIG. 16 is an example data point graph for illustrating points generated from an example calibration of a magnetometer.

An example data point graph is provided in FIG. 16 illustrating an example cluster 1300 enclosing a plurality of proximity points 1600. In this example, the cluster 1300 is defined as the smallest rectangular parallelepiped enclosing a plurality of proximity points 1600 obtained from an example magnetometer calibration 700. The cluster 1300 has the dimensions of $C_x$, $C_y$ and $C_z$ in the x, y and z axis of the magnetometer 25, respectively.

Figure 17:
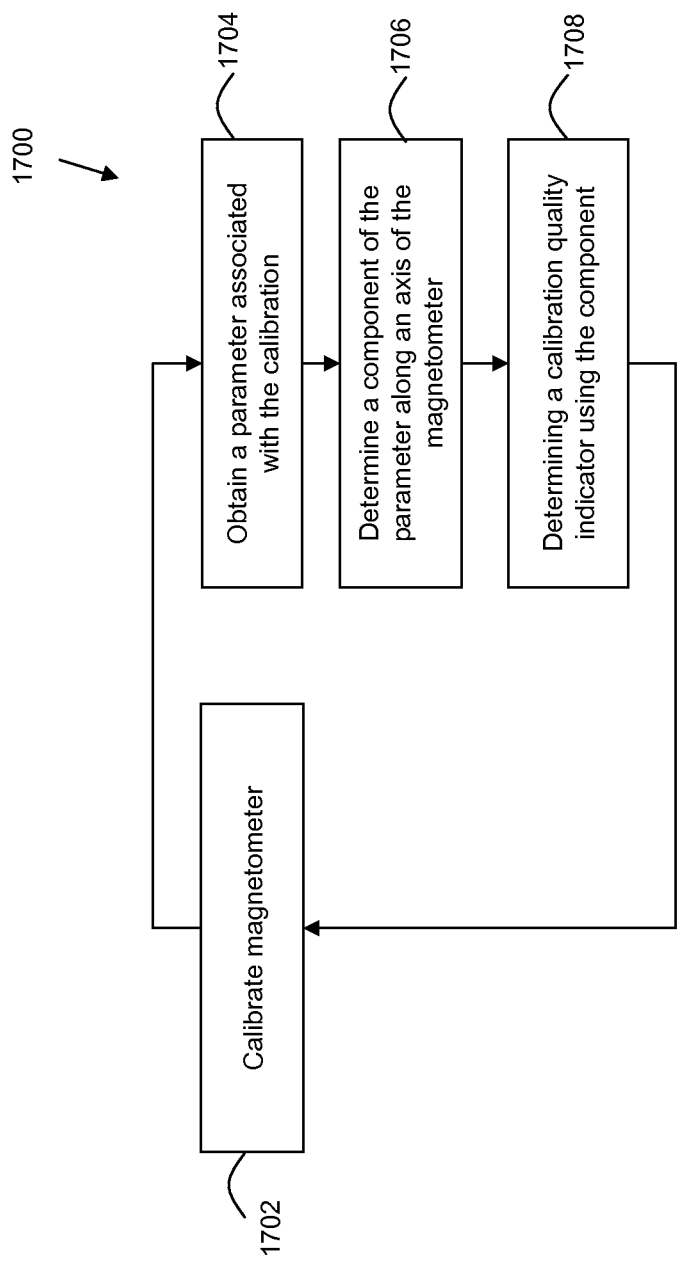
FIG. 17 is a flow chart including an example of a set of computer executable operations for evaluating a calibration of a magnetometer.

FIG. 17 illustrates an example of a set of computer executable operations 1700 for evaluating a calibration of a magnetometer using a parameter associated with the calibration, such as the size of cluster 1300. In an example configuration of the mobile device 10 of FIG. 5, the computer executable operations 1700 may be executed by the magnetometer calibration module 26.

The calibration evaluation 1700 can occur after the magnetometer 25 has been calibrated according to a magnetometer calibration at 1702, or concurrently with the magnetometer calibration at 1702 to provide continuous feedback to the magnetometer calibration.

At 1704, a parameter associated with the magnetometer calibration is obtained. In the example magnetometer calibration 700, the parameter can be a property of the cluster 1300, such as the cluster size. The size of a cluster 1300 can represent a degree of proximity between the proximity points 1600. A smaller cluster size suggests higher quality calibration as underlying data (e.g. proximity points) used to generate the calibration parameters has less variation. A larger cluster size suggests a lower quality calibration as underlying data used to generate the calibration parameters has greater variation. The size of a cluster 1300 can be any measure of proximity of the points within the cluster, such as a physical property of the cluster 1300 (e.g. dimensions) or an indicator of variation in the proximity points within the cluster (e.g. standard deviation, variance, sum of the minimum distances between each proximity point with other proximity point in the cluster, etc.).

At 1706, one or more components, along a respective axis of the magnetometer 25, of the parameter associated with the calibration is determined. In one example, a component can be determined as the projection of the cluster 1300 on each of the x, y and z axes to obtain its dimensions of $C_x$, $C_y$ and $C_z$, respectively. Each component can be used as a separate quality indicator at 1708.

In another example, the components of the calibration parameter generated by the magnetometer calibration may be used in determining a set of calibration quality indicators. The calibration parameter may change over time as the magnetometer calibration is performed. The rate of change in the calibration parameter along each of the x, y and z axes of the magnetometer 25 may be used as separate calibration quality indicators.

In the example magnetometer calibration 700, the calibration parameter can represent the constant bias $\vec{E}$ and thus, higher rates of change in each component of the calibration parameter may indicate a lower calibration quality. It will be appreciated that other parameters used in calibrating a magnetometer 25, or that can be derived from parameters used in calibrating a magnetometer 25, may be projected on to an axis of the magnetometer 25 for use as separate calibration quality indicator.

Providing a calibration quality indicator with respect to an individual axis of a magnetometer 25 may enable the mobile device 10 to recognize that the magnetometer 25 is still operable when one or more axes have a high calibration quality, while one or more other axes have a low calibration quality. Certain applications 36 running on the mobile device 10 may not be interested in the component of the magnetic field in the axis with low calibration quality. For example, a mobile device 10 using a 2D compass application 38 may be oriented in a substantially horizontal orientation during operation such that there is minimal change in the z axis component of the magnetic field. The magnetometer 25 may still provide sufficiently accurate magnetometer readings to enable the 2D compass application to perform its function (i.e. point towards magnetic north and/or provide the horizontal intensity of the magnetic field) as long as the magnetometer 25 is calibrated along the x and y axes.

In another embodiment, a magnetometer 25 may obtain a plurality of error indicators, including calibration quality indicators described above. A calibration quality indicator can provide a measure of confidence in a magnetometer calibration by determining a degree of variation or charge in various parameters of the magnetometer calibration that would ideally be constant. For example, the cluster size of the magnetometer calibration 700 would be single, constant point in an ideally calibrated magnetometer. Any variation in proximity points of the magnetometer calibration 700 increases the size of the cluster 1300, and thus indicates a lower calibration quality. As discussed above, the calibration quality indicator can also be projected on to an individual axis of the magnetometer sensor 22.

Another example of an error indicator can be a magnetometer accuracy indicator which measures the difference between the measured magnetic field by the magnetometer 25 and the expected Earth's magnetic field. As mentioned above, the expected magnetic field can be obtained from a data model of the Earth's magnetic field, such as the WMM, based on a location of the mobile device 10. From the data model, the expected magnetic field strength, expected inclination angle, expected horizontal field intensity or other parameters of the expected magnetic field can be obtained or derived. In one example, the expected magnetic field may be oriented in same frame of reference as the measured magnetic field of the mobile device 10 by rotating the expected magnetic field by the orientation matrix 35. Once the expected magnetic field and the measured magnetic field are defined within the same frame of reference, the difference in various properties of the magnetic fields may be determined, such as magnetic field strength and inclination angle, to quantify an error.

Another example of an error indicator can be an interference removal quality indicator which measures the ability of the magnetometer 25 to measure magnetic interference such as a localized magnetic field from a nearby magnet. In one example, a magnetometer 25 that closely tracks the magnetic interference demonstrates a low interference removal quality value since the magnetometer 25 is highly influenced by magnetic interference. This may be desirable in some applications 36, such as a stud finder application. In another example, a compass application 38 may be calibrated to remove magnetic interference such that the application points to the magnetic North direction irrespective of the magnetic interference in the vicinity, thus having a high interference removal quality indicator value.

Another example of an error indicator can be a rotational quality indicator which measures the difference between the angular movement of a magnetic field measured by a calibrated magnetometer 25 and the angular movement measured by a rotational sensor, such as the gyroscope 24. In one example, the rotation of the measured magnetic field can be determined from a change in the orientation matrix 35. As discussed above, a magnetometer reading 28 is used to generate the NORTH and EAST vectors of the orientation matrix 35. Therefore, evaluating changes in the orientation matrix 35 can indirectly evaluate the magnetometer 25. The rotation of the orientation matrix 35 and gyroscope reading 42 can be represented in a common form, such as the axis-angle representation, so that the rotations can be compared. A large difference in the rotations can result in a low rotational quality indicator value while a small difference can result in a high rotational quality indicator.

As the rotation measurement of the gyroscope 24 is taken independently from the magnetometer 25, a rotational quality indicator may provide a neutral metric to compare two or more magnetometer calibrations. It will be appreciated that any one or more of the above error indicators can be used to compare and select from a plurality of magnetometer calibrations.

It can be seen that a number of different types of error indicators can be determined for a magnetometer 25, each of which can have different criteria for defining error. For example, calibration quality indicator can be based on consistency in a value of a magnetometer reading, irrespective of the correctness of the value generated, whereas a magnetometer accuracy indicator can be based on the correctness of the magnetometer reading. Therefore, providing an application 36 or 38 of the mobile device 10 with a plurality of types of error indicators may enable the application 36 or 38 to respond more effectively to magnetic influences.

Figure 18:
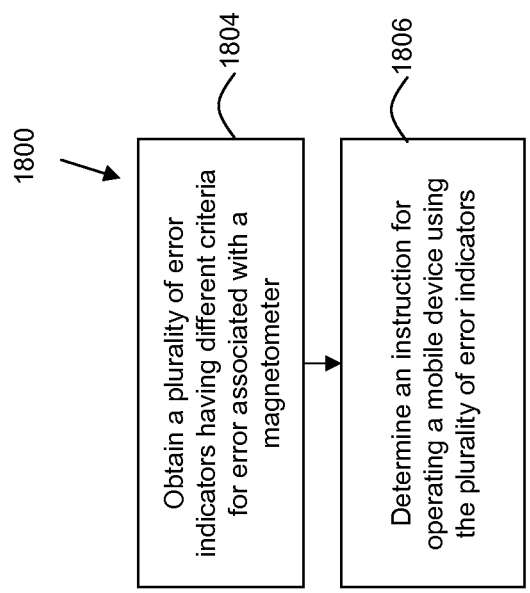
FIG. 18 is a flow chart including an example of a set of computer executable operations for operating a mobile device having a magnetometer.

FIG. 18 illustrates an example of a set of computer executable operations 1800 for operating a mobile device 10 having a magnetometer 25. In an example configuration of the mobile device 10 of FIG. 5, the computer executable operations 1800 can be executed by an application 36 or 38. At 1802, a plurality of error indicators associated with the magnetometer are obtained. The plurality of error indicators can each use different criteria to determine error. At 1804, an instruction for controlling the electronic device using the plurality of error indicators is determined.

In one example, the plurality of error indicators can include a calibration quality indicator and a magnetometer accuracy indicator, each of which can take on the values LOW, MODERATE and HIGH. An application, such as a compass application 38, may obtain a calibration quality indicator having the value HIGH and a magnetometer accuracy indicator having the value LOW at 1802. At 1804, the compass application 38 may be operable to determine that, despite obtaining a LOW magnetometer accuracy indicator, calibration may not be necessary since the calibration quality indicator is HIGH. The compass application 38 may also be operable to infer that the cause of the LOW magnetometer accuracy is likely due to magnetic interference in the environment, which recalibration of the magnetometer 25 may not address. Instead of recalibrating the magnetometer 25, the compass application 38 may instruct the mobile device 10 to display a message on the display 14 or 15 to communicate to a user to move the mobile device 10 away from metal objects or other magnetic field sources in the nearby area in an attempt to reduce or remove the magnetic interference. In another example, the compass application 38 may also obtain an interference removal quality indicator that is LOW, thus supporting the inference that magnetic interference is likely the cause of the LOW magnetometer accuracy indicator, and not poor calibration of the magnetometer 25.

It will be appreciated that if the compass application 38 merely obtained one error indicator, such as the magnetometer accuracy indicator, the compass application 38 may perform unnecessary calibration. It will also be appreciated that the mobile device 10 can use the plurality of error indicators to determine various types of instructions such as displaying a user prompt, automatically performing calibration or another operation that can be performed by the mobile device 10.

It will be understood that multiple error indicators can be used together in a number of ways, including weighted averages based on the type of each error indicator and the nature of the application. For example, a stud finder application 36 may weight the magnetometer accuracy indicator lower than the interference removal quality indicator as stud finder application 36 is more interested in identifying magnetic interference.

As mentioned above, changes in state of a mobile device 10 can be used to trigger a calibration of the magnetometer 25 in order to compensate or account for changing environments or effects from moving between different operating states. For example, the holster, slider and flip states shown in FIGS. 2 to 4 (i.e. holstered/unholstered, and opened/closed states as determined by device sensors) can be used to determine when to re-calibrate the magnetometer 25. It has been recognized that changes in these states can have a direct impact on the performance of the magnetometer 25. For example, a slider mechanism for sliding the keyboard 18 out from behind a touch screen display 15 may include various metal parts as well as several magnets. It has been found that the performance of the magnetometer 25 and the resultant calibration parameters that would be calculated can be very different depending on when the slider is opened versus closed. As such, the holster, slider, and flip states may therefore be monitored to detect a change in state and to trigger a calibration of the magnetometer.

Figure 19:
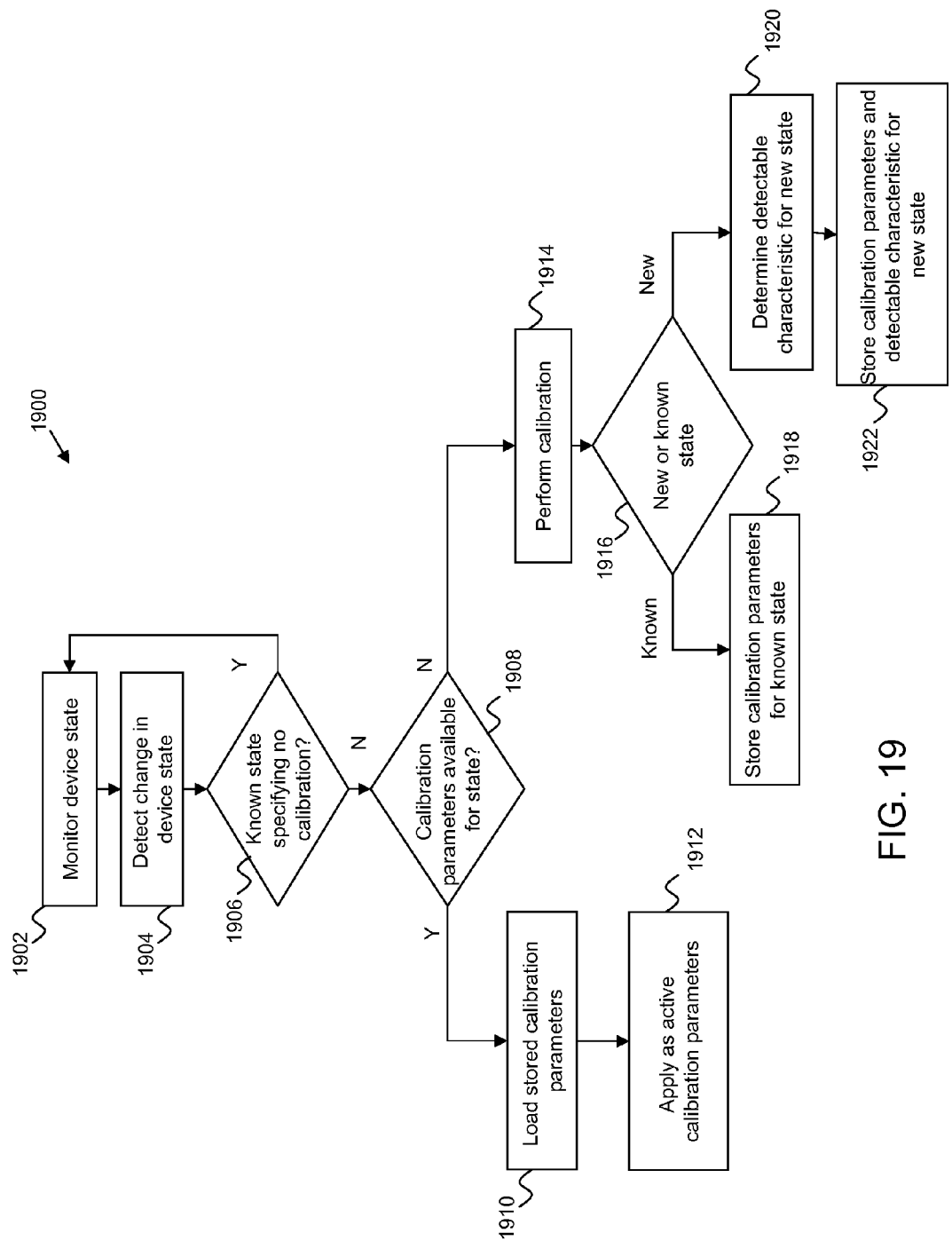
FIG. 19 is a flow chart including another example of a set of computer executable operations for calibrating a magnetometer of a mobile device.

FIG. 19 illustrates another example of a set of computer executable operations 1900 for calibrating a magnetometer 25 on a mobile device 10. In an example configuration of the mobile device 10 of FIG. 5, the example magnetometer calibration 1900 may be executed by the magnetometer calibration module 26.

At 1902, the state of the mobile device 10 may be monitored to detect a change in state at 1904. The magnetometer calibration module 26 in this example may be operable to continually track or otherwise become aware of the current state of the mobile device 10. The current state in this example, when known, may be denoted K, and any N number of states may be tracked. For example, a slider-equipped device such as that shown in FIG. 3 may have N=3 states, namely K=0 when out of holster and slider closed, K=1 when out of holster and slider opened, and K=2 when in holster (assuming the slider cannot be opened when the mobile device 10 is holstered). It can be appreciated that different device types may have different numbers of states and thus different allowable ranges for K. It can also be appreciated that the current state may not be known but a one or more new calibration parameters can be generated and stored and a new state K can be created as will be discussed below.

The magnetometer calibration module 26 may then determine if the current state is a known state K that specifies that no calibration is needed at 1906. In the case of certain physical device configurations, it has been found that the magnetometer sensor 22 does not perform well, or possibly even work at all. For example, the device holster 20 may contain large magnets (both to activate the holster sensor as well as to keep the holster flap closed). When the mobile device 10 is inside the holster, the magnetometer sensor 22 and applications 36 using the magnetometer sensor 22 likely will not work. For such device configurations, the magnetometer calibration module 26 can use the indication of a known state K to avoid attempting to re-calibrate the magnetometer sensor 22 in an environment in which the magnetometer sensor 22 likely cannot be calibrated. Moreover, in states such as a holstered state, it may be more likely that the applications 36 using the magnetometer 25 are not being used since the holster 20 effectively stows the mobile device 10 providing further incentive to avoid unnecessary calibrations.

The magnetometer calibration module 26 can then determine at 1908 if one or more calibration parameters are available for the current state, such that the module 26 can load the appropriate parameters for the new K value whenever K changes, or generate new calibration parameters for a known state K that does not currently have a set of calibration parameters, or determine that a new state exists and generate a new K value and a corresponding set of calibration parameters.

If stored calibration parameters exist for the detected state, the stored calibration parameters can be loaded at 1910. For example, the calibration parameters may be previously generated using the example magnetometer calibration 700 or 1400. In the example magnetometer calibration 700, the calibration parameters may include a constant bias of the magnetometer sensor 22, as well as one or more quality indicators of the calibration (e.g. cluster size). Therefore, it can be seen that calibration of a magnetometer 25 may be achieved without operating on magnetometer readings to generate new calibration parameters if existing calibration parameters already exist.

Referring back to 1908, if no stored calibration parameters exist yet for a known state K (e.g. if it is the first time that the user has used the mobile device 10 in that state), or the current state is unknown or otherwise not yet associated with a state K, the magnetometer calibration module 26 can calibrate the magnetometer 25 at 1914 using a magnetometer calibration such as the magnetometer calibration 700 or 1400. The magnetometer calibration module 26 may then determine at 1916 whether the state is new or known. If the current state is a known state K, the newly acquired calibration parameters for K may be stored at 1918, e.g. in non-volatile memory, so that they can be used again whenever the mobile device 10 is used in that state K. If the current state is not a known state K, but the state is determined to be a common or otherwise repeatable state (e.g. when tethered to another device, accessing a particular Wi-Fi network, paired with a known other device via Bluetooth, etc.), a detectable characteristic is determined at 1920 and the characteristic stored with the newly acquired calibration parameters at 1922. In this way, a new state K is created and the associated parameters stored for subsequent use. When the detectable characteristic is detected, the new state K can be used to access and load the previously stored calibration parameters.

The detectable characteristic can be determined automatically, e.g. using something detected by the OS 134 or an application 36, or by prompting the user to identify the new state. For example, after determining that the mobile device 10 is in a new or otherwise previously unaccounted for state, the magnetometer calibration module 26 may prompt the user to confirm that the detectable characteristic can be associated with a state and have the user identify the state. This enables the magnetometer calibration module 26 to identify or be notified of a potential new state and have this information confirmed. For example, the OS 134 may indicate that the mobile device 10 is paired with a particular device or connected to a network (e.g. via Wi-Fi). The prompt provided by the magnetometer calibration module 26 may then indicate the presence of this pairing or network connection and ask the user to confirm that a new state K may be associated with that pairing or connection.

A determinable characteristic of a state may be based on an intermediate parameter associated with a magnetometer calibration. Since a state of the mobile device 10 may have unique magnetic influences, an intermediate parameter associated with the calibration may also be unique to a particular state, and thus, such a parameter may be stored as a determinable characteristic of the state at 1922. The current device state may then be detected at 1904 by initiating a magnetometer calibration, and determining whether an intermediate parameter associated with the magnetometer calibration corresponds to a determinable characteristic of a state. If stored calibration parameters exist for the detected state, the magnetometer calibration can then terminate at 1908. Otherwise, the magnetometer calibration can continue to completion at 1914.

In one example, a cluster 1300 from a previous magnetometer calibration 700 may be stored as a determinable characteristic of a state at 1922. During subsequent detection of a change in state at 1904, a magnetometer calibration 700 can be initiated to detect the current state. In this example, one or more properties of a profile of a previously generated intermediate parameter may be used as the determinable characteristic. A known state may be detected if a specific number of rotation axes or proximity points generated during the current calibration at 1904 passes through or lies within the space bounded by the stored cluster 1300 (i.e. the determinable characteristic) associated with the known state. In another example, a known state may be detected if a sequence of proximity points generated during the current calibration at 1904 are determined to be approaching the space bounded by the stored cluster 1300 associated with the known state.

It will be appreciated that other criteria may be used to enable one or more intermediate parameters associated with a magnetometer calibration to indicate a state of the mobile device 10. It will also be appreciated that the intermediate parameters associated with a calibration may be used in combination with other determinable characteristics to detect a state or confirm that a state has been detected correctly.

It will be appreciated that the examples and corresponding diagrams used herein are for illustrative purposes only. Different configurations and terminology can be used without departing from the principles expressed herein. For instance, components and modules can be added, deleted, modified, or arranged with differing connections without departing from these principles.

The steps or operations in the flow charts and diagrams described herein are just for example. There may be many variations to these steps or operations without departing from the spirit of the invention or inventions. For instance, the steps may be performed in a differing order, or steps may be added, deleted, or modified.

Although the above principles have been described with reference to certain specific embodiments, various modifications thereof will be apparent to those skilled in the art without departing from the scope of the claims appended hereto.

The invention claimed is:

1. A method of operating a mobile device having a magnetometer, the method comprising:
    obtaining a first plurality of error indicators associated with the magnetometer, the first plurality of error indicators comprising a respective error indicator for each of: a degree of variation in a magnetometer calibration parameter, an accuracy to an expected magnetic field, and an ability to track magnetic interference;
    comparing the first plurality of error indicators with one another; and
    determining an instruction for operating the mobile device based on the comparison of the first plurality of error indicators.

2. The method of claim 1, wherein the first plurality of error indicators is associated with the magnetometer calibrated with a first magnetometer calibration, and the method further comprising:
    obtaining a second plurality of error indicators associated with the magnetometer calibrated with a second magnetometer calibration, each of the second plurality of error indicators corresponding to a respective one of the first plurality of error indicators.

3. The method of claim 2 further comprising comparing each of the second plurality of error indicators to the respective one of the first plurality of error indicators, and wherein the instruction comprises selecting one of the first magnetometer calibration and the second magnetometer calibration based on the comparison of each of the second plurality of error indicators to the respective one of the first plurality of error indicators.

4. The method of claim 1, wherein the first plurality of error indicators further comprises an error indicator for an accuracy to an angular position of the mobile device.

5. The method of claim 1, wherein the instruction comprises instructing a user to move the mobile device.

6. The method of claim 1, wherein the instruction comprises calibrating the magnetometer.

7. A non-transitory computer readable storage medium for operating a mobile device having a magnetometer, the computer readable storage medium comprising computer executable instructions that when executed by a processor cause the processor to perform operations comprising:
    obtaining a first plurality of error indicators associated with the magnetometer, the first plurality of error indicators comprising a respective error indicator for each of: a degree of variation in a magnetometer calibration parameter, an accuracy to an expected magnetic field, and an ability to track magnetic interference;
    comparing the first plurality of error indicators with one another; and
    determining an instruction for operating the mobile device based on the comparison of the first plurality of error indicators.

8. The non-transitory computer readable storage medium of claim 7, wherein the first plurality of error indicators is associated with the a magnetometer calibrated with a first magnetometer calibration, and the computer readable storage medium further comprising computer executable instructions for:
    obtaining a second plurality of error indicators associated with the magnetometer calibrated with a second magnetometer calibration, each of the second plurality of error indicators corresponding to a respective one of the first plurality of error indicators.

9. The non-transitory computer readable storage medium of claim 8 further comprising computer executable instructions for comparing each of the second plurality of error indicators to the respective one of the first plurality of error indicators, and wherein the instruction comprises selecting one of the first magnetometer calibration and the second magnetometer calibration based on the comparison of each of the second plurality of error indicators to the respective one of the first plurality of error indicators.

10. The non-transitory computer readable storage medium of claim 7, wherein the first plurality of error indicators further comprises an error indicator for an accuracy to an angular position of the mobile device.

11. The non-transitory computer readable storage medium of claim 7, wherein the instruction comprises instructing a user to move the mobile device.

12. The non-transitory computer readable storage medium of claim 7, wherein the instruction comprises calibrating the magnetometer.

13. A mobile device comprising a processor coupled to a non-transitory memory and a magnetometer, the memory comprising computer executable instructions that when executed by a processor cause the processor to perform a method comprising:
   obtaining a first plurality of error indicators associated with the magnetometer, the first plurality of error indicators comprising a respective error indicator for each of: a degree of variation in a magnetometer calibration parameter, an accuracy to an expected magnetic field, and an ability to track magnetic interference;
   comparing the first plurality of error indicators with one another; and
   determining an instruction for operating the mobile device based on the comparison of the first plurality of error indicators.

14. The mobile device of claim 13, wherein the first plurality of error indicators is associated with the magnetometer calibrated with a first magnetometer calibration and the memory further comprises computer executable instructions for:
   obtaining a second plurality of error indicators associated with the magnetometer calibrated with a second magnetometer calibration, each of the second plurality of error indicators corresponding to a respective one of the first plurality of error indicators.

15. The mobile device of claim 14, wherein the memory further comprises computer executable instructions for comparing each of the second plurality of error indicators to the respective one of the first plurality of error indicators, and wherein the instruction comprises selecting one of the first magnetometer calibration and the second magnetometer calibration based on the comparison of each of the second plurality of error indicators to the respective one of the first plurality of error indicators.

16. The mobile device of claim 13, wherein the instruction comprises instructing a user to move the mobile device.

17. The mobile device of claim 13, wherein the first plurality of error indicators further comprises an error indicator for an accuracy to an angular position of the mobile device.

18. The mobile device of claim 13, wherein the instruction comprises calibrating the magnetometer.

* * * * *